(12) United States Patent
Toyomura et al.

(10) Patent No.: US 9,368,064 B2
(45) Date of Patent: *Jun. 14, 2016

(54) DISPLAY PANEL, DISPLAY APPARATUS, AND ELECTRONIC SYSTEM

(71) Applicant: JOLED Inc., Tokyo (JP)

(72) Inventors: Naobumi Toyomura, Kanagawa (JP); Junichi Yamashita, Tokyo (JP); Satoshi Tagami, Ibaraki (JP)

(73) Assignee: JOLED Inc., Tokyo (JP)

( * ) Notice: Subject to any disclaimer, the term of this patent is extended or adjusted under 35 U.S.C. 154(b) by 396 days.

This patent is subject to a terminal disclaimer.

(21) Appl. No.: 13/950,619

(22) Filed: Jul. 25, 2013

(65) Prior Publication Data

US 2014/0035965 A1 Feb. 6, 2014

(30) Foreign Application Priority Data

Jul. 31, 2012 (JP) .................. 2012-170305

(51) Int. Cl.
*G09G 3/32* (2016.01)
*G09G 3/20* (2006.01)
*G09G 3/30* (2006.01)
*H01L 27/32* (2006.01)

(52) U.S. Cl.
CPC ............ *G09G 3/3233* (2013.01); *G09G 3/2011* (2013.01); *G09G 3/2018* (2013.01); *G09G 3/30* (2013.01); *H01L 27/3213* (2013.01); *H01L 27/3262* (2013.01); *G09G 3/3291* (2013.01); *G09G 2310/0251* (2013.01); *G09G 2310/0256* (2013.01); *G09G 2320/045* (2013.01); *H01L 27/3211* (2013.01)

(58) Field of Classification Search
CPC ......... G09G 3/30; G09G 3/32; G09G 3/3208; G09G 3/3225; G09G 3/3233; G09G 2320/043–2320/048
See application file for complete search history.

(56) References Cited

U.S. PATENT DOCUMENTS

| 6,771,028 B1 * | 8/2004 | Winters | ............... G09G 3/3233 315/169.1 |
| 2005/0264500 A1 * | 12/2005 | Shirasaki | ............. G09G 3/3225 345/77 |
| 2008/0029768 A1 | 2/2008 | Asano et al. | |

FOREIGN PATENT DOCUMENTS

| JP | 2001-264818 A | 9/2001 |
| JP | 2008-39876 A | 2/2008 |
| JP | 2008-083272 | 4/2008 |

OTHER PUBLICATIONS

Japanese Office Action issued on Mar. 29, 2016, for JP 2012-170305.

*Primary Examiner* — David Tung
(74) *Attorney, Agent, or Firm* — Michael Best & Friedrich LLP

(57) ABSTRACT

A color display unit includes pixels arranged in matrix form. Display pixel units are formed from multiple pixels, one of each of the display colors, grouped together across multiple rows. Drive units are formed by multiple rows of display pixel units that are connected to a common power supply line. Common write scanning lines are provided, where the number of common write scanning lines per drive unit equals the number of rows of pixels that are included in a display pixel unit. Each common write scanning line is connected to every pixel of at least one given color in its respective drive unit. Within a single drive unit, every pixel of a given color has a transistor whose layout orientation is the same as the layout orientation of a corresponding transistor in every other pixel of that given color.

18 Claims, 20 Drawing Sheets

FIG. 7

| | DTL(m) | DTL(m+1) | DTL(m+2) | DTL(m+3) |
|---|---|---|---|---|
| V(p) | Vsig(n, m) | Vsig(n+2, m+1) | Vsig(n, m+2) | Vsig(n+2, m+3) |
| V(p+1) | Vsig(n+1, m) | Vsig(n+3, m+1) | Vsig(n+1, m+2) | Vsig(n+3, m+3) |
| V(p+2) | Vsig(n+4, m) | Vsig(n+6, m+1) | Vsig(n+4, m+2) | Vsig(n+6, m+3) |
| V(p+3) | Vsig(n+5, m) | Vsig(n+7, m+1) | Vsig(n+5, m+2) | Vsig(n+7, m+3) |

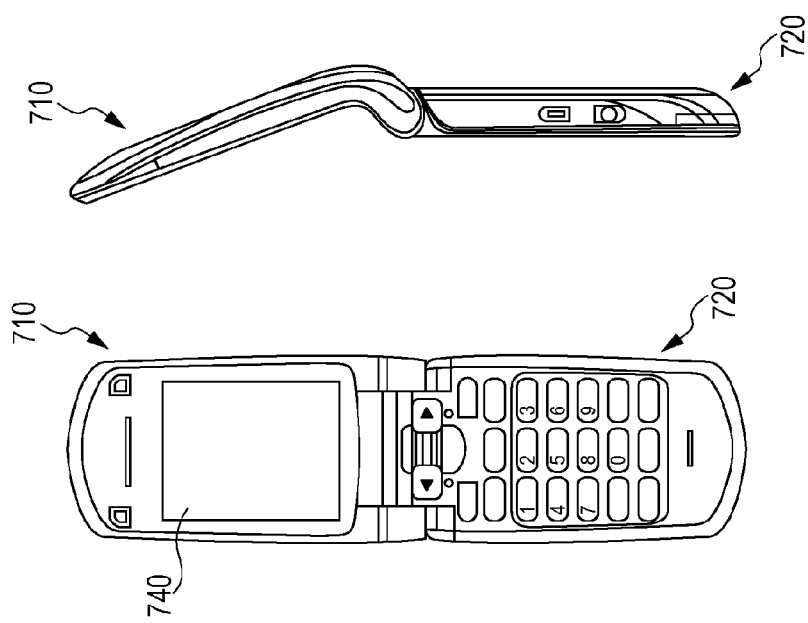
FIG. 21A
FIG. 21B
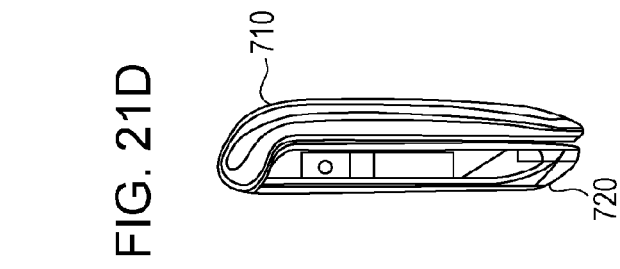
FIG. 21D
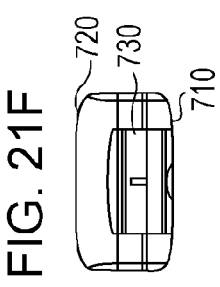
FIG. 21F
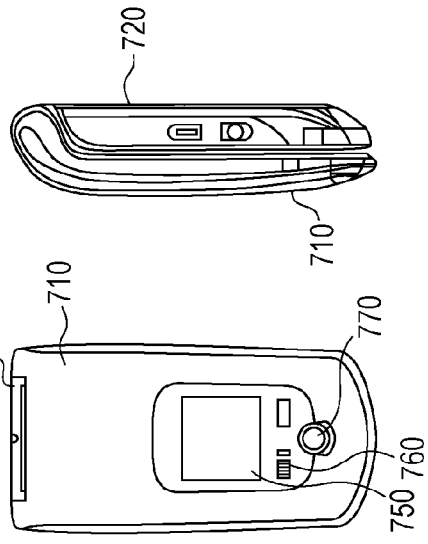
FIG. 21C
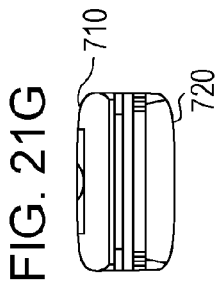
FIG. 21G
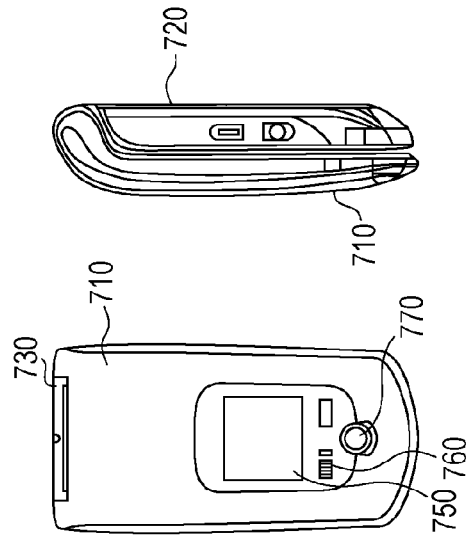
FIG. 21E

DISPLAY PANEL, DISPLAY APPARATUS, AND ELECTRONIC SYSTEM

BACKGROUND

The present technique relates to a display panel including a light emitting element, such as an organic EL (Electro Luminescence) element, and so on, for example, for each pixel, and to a display apparatus and an electronic system including the display panel.

In recent years, in a field of display apparatuses for displaying images, developments have been made on display apparatuses using a current-driven light emitting element, which changes luminance in accordance with a flowing current value, such as an organic EL element, for example, as a light emitting element of a pixel. And product commercialization of the apparatuses is in progress. The organic EL element is a self-luminous element unlike a liquid crystal element, and so on. Accordingly, in a display apparatus using organic EL elements (organic EL display apparatus), a light source (backlight) is not necessary, and thus compared with a liquid-crystal display apparatus that necessitates a light source, it is possible to make the apparatus thinner and brighter.

Incidentally, in general, a current-voltage (I-V) characteristic of an organic EL element deteriorates with passage of time (deterioration with time). In a pixel circuit in which an organic EL element is driven by current, when an I-V characteristic of the organic EL element changes with time, a change occurs in a division ratio between an organic EL element and a drive transistor connected to the organic EL element in series, and thus a gate-source voltage of the drive transistor also changes. As a result, a value of the current flowing through the drive transistor changes, and a value of the current flowing through the organic EL element changes, thereby changing luminance in accordance with the current value.

Also, a threshold voltage (Vth) or mobility ($\mu$) of a drive transistor sometimes changes with time. Also, the Vth and the $\mu$ sometimes changes for each pixel circuit in accordance with variations in production process. When the Vth or the $\mu$ of a drive transistor changes for each pixel circuit, a value of the current flowing through the drive transistor varies for each pixel circuit. Even if a same voltage is applied to the gate of the drive transistor, luminance of the organic EL elements varies, and thus uniformity of the screen is lost.

Thus, even an I-V characteristic of an organic EL element changes with time, or Vth and $\mu$ of a drive transistor changes with time, in order to keep the luminance of the organic EL element at a certain value without being affected by those changes, developments are being made on a display apparatus in which a correction function on variations of the I-V characteristic of the organic EL element and a correction function on variations of the Vth and the $\mu$ of the drive transistor are incorporated (for example, refer to Japanese Unexamined Patent Application Publication No. 2008-083272).

SUMMARY

Incidentally, for example, in a related-art drive method as illustrated in FIG. 11, Vth correction, in which the gate-source voltage of the drive transistor is brought close to the threshold voltage of the drive transistor, and signal writing, in which a signal voltage in accordance with an image signal is written into the gate of the drive transistor, are carried out for each 1H period. Accordingly, in this drive method, it has been difficult to shorten 1H period, and to shorten a scanning period for each 1F (that is to say, to drive at a high speed). Thus, for example, as illustrated in FIG. 12, Vth correction is performed for two lines together in a common 1H period, and then signal writing is performed in the next 1H period for each line. In this drive method, the Vth corrections are bundled, and thus the drive method is suitable for driving at a high speed. However, a waiting period $\Delta t$, from when Vth correction is ended to when signal writing is started, is different for each line. Accordingly, even if a signal voltage having a same grayscale is applied to the gate of the drive transistor of each line, luminance becomes different for each line, and thus there has been a problem in that luminance unevenness arises.

Thus, for example, it is thought that changes are made to the layout and the wiring of the pixel circuit, further, the drive method, and so on. However, if those changes are made, the layout and the wiring of the pixel circuit become complicated. As a result, there has been a problem in that it becomes difficult to make the characteristic of each pixel uniform at the time of producing a pixel circuit and wiring in a manufacturing process because of mask misalignment.

In this regard, such a problem is not specific to an organic EL display apparatus, but is a common problem that arises in a display apparatus in which the layout and the wiring of the pixel circuit are complicated.

The present technique has been made in view of such problems. It is desirable to provide a display panel that allows making the characteristic for each pixel more uniform even if the layout and the wiring of the pixel circuit become complicated. It is also desirable to provide a display apparatus and an electronic system including such a display panel.

According to an exemplary illustration of the subject matter of the disclosure, a display unit may include: a plurality of write scanning lines; a plurality of signal lines; and a plurality of pixel circuits disposed in a matrix form comprising rows and columns of pixel circuits. Each of the plurality of pixel circuits may include: a display element; a first transistor configured to sample a potential carried on one of the plurality of signal lines when a scanning pulse may be applied to one of the plurality of write scanning lines; which may be connected to the first transistor; a capacitor with a first terminal configured to hold the potential sampled by the first transistor; and a second transistor configured to supply a drive current to the display element, the magnitude of the drive current corresponding to a voltage between the first terminal of the capacitor and a second terminal of the capacitor. Each of the plurality of pixel circuits may correspond to one of N display colors and the plurality of pixel circuits may be grouped into display pixel units each comprising N of the plurality of pixel circuits corresponding respectively to the N display colors, which may be contiguously disposed in R contiguous rows, $2 \leq R \leq N$. Further, the first transistor of a given one of the plurality of pixel circuits included in a first one of the display pixel units may be disposed in a same layout orientation as the first transistor of the one of the plurality of pixel circuits included in a second one of the display pixel units adjacent to the first one of the display pixel units in a column direction that corresponds to a same color as the given one of the plurality of pixel circuits.

Further, in the exemplary display unit described above, for each of the plurality of pixel circuits included in the first one of the display pixel units and the second one of the display pixel units adjacent to the first one of the display pixel units in a column direction, the first transistors of those pixel circuits corresponding to a same color as each other may be disposed in a same layout orientation as each other.

Further, the exemplary display unit described above may also include a plurality of power supply lines, each connected to two respectively corresponding adjacent rows of the plurality of pixel circuits. The plurality of write scanning lines may be each connected to ones of the plurality of pixel circuits that may be disposed in a corresponding row of pixel circuits, and the plurality of signal lines may be each connected to ones of the plurality of pixel circuits that may be disposed in a corresponding column of pixel circuits. The plurality of pixel circuits may be grouped into drive units each comprising K≥4 contiguous rows of pixel circuits that may be connected to a corresponding unit power supply line, which may be made up of K/2 of the plurality of power supply lines configured as a common line. Each of the drive units may include L≥2 unit write scanning lines that each comprise R≥2 of the plurality of write scanning lines configured as a common line, where K=L·R. Each unit write scanning line may correspond to at least one of the display colors and may be connected to all of the pixel circuits that correspond to any of the display colors to which the respective unit write scanning line corresponds and that may be included in the drive unit to which the respective unit write scanning line belongs.

Further, in the exemplary display unit described above, for each of the plurality of pixel circuits included in the given one of the drive units, the first transistors of those pixel circuits connected to a same unit write scanning line as each other may be disposed in a same layout orientation as each other.

Further, in the exemplary display unit described above, for each of the plurality of pixel circuits included in the given one of the drive units, the second transistors of those pixel circuits connected to a same unit write scanning line as each other may be disposed in a same layout orientation as each other.

Further, the exemplary display unit described above may also include a drive control section configured to cause the plurality of pixel circuits to display image frames corresponding to input image data by control driving of the plurality of write scanning lines, the plurality of signal lines, and the plurality of power supply lines. The plurality of pixel circuits may be configured to perform, under control of the drive control section, a threshold correction operation that results in storing a threshold voltage of the second transistor of the respective one of the plurality of pixel circuit in the capacitor of the respective one of the plurality of pixel circuit, and the drive control section may be configured to cause each of the plurality of pixel circuits included in the given one of the drive units to perform the threshold correction operation simultaneously during a given image frame period.

Further, in the exemplary display unit described above the drive control section may be configured to cause each of the plurality of pixel circuits included in the given one of the drive units to perform the threshold correction operation by causing the first transistor of the respective pixel circuit to be in a conductive state while a reference potential is carried on the signal line connected to the respective pixel circuit and while a drive voltage is applied to the second transistor of the respective pixel circuit.

Further, in the exemplary display unit described above the drive control section may be configured to cause the plurality of pixel circuits to perform a signal writing operation of sampling a video signal potential by placing the first transistor of the respective pixel circuit in a conductive state while a video signal potential is applied to the signal line connected to the respective pixel circuit. The signal writing operation may be performed during the given image frame period simultaneously for those of the plurality of pixel circuits connected to a same unit write scanning line. For pixel circuits connected to different unit write scanning lines from each other, the signal writing operation may be performed during the given image frame period at different respective timings.

Further, in the exemplary display unit described above N may equal 4, R may equal 2, K may equal 4, and the display colors may include red, green, and blue.

Further, in the exemplary display unit described above the display colors may also include white.

Further, in the exemplary display unit described above the display colors may also include yellow.

According to an aspect of a second exemplary illustration of the subject matter of the disclosure, a display unit may include: a plurality of write scanning lines; a plurality of signal lines; and a plurality of pixel circuits disposed in a matrix form comprising rows and columns of pixel circuits. Each of the plurality of pixel circuits may include: a display element; a first transistor configured to sample a potential carried on one of the plurality of signal lines when a scanning pulse may be applied to one of the plurality of write scanning lines, which may be connected to the first transistor; a capacitor with a first terminal configured to hold the potential sampled by the first transistor; and a second transistor configured to supply a drive current to the display element, the magnitude of the drive current corresponding to a voltage between the first terminal of the capacitor and a second terminal of the capacitor. Each of the plurality of pixel circuits may correspond to one of four display colors and the plurality of pixel circuits may be grouped into display pixel units each comprising four of the plurality of pixel circuits corresponding respectively to the four display colors, which may be contiguously disposed in two adjacent rows. The first transistor of a given one of the plurality of pixel circuits included in a first one of the display pixel units may be disposed in a same layout orientation as the first transistor of the one of the plurality of pixel circuits included in a second one of the display pixel units adjacent to the first one of the display pixel units in a column direction that corresponds to a same color as the given one of the plurality of pixel circuits.

Further, in the second exemplary display unit described above, for each of the plurality of pixel circuits included in the first one of the display pixel units and the second one of the display pixel units adjacent to the first one of the display pixel units in a column direction, the first transistors of those pixel circuits corresponding to a same color as each other may be disposed in a same layout orientation as each other.

Further, the second exemplary display unit described above may also include a plurality of power supply lines, each connected to two respectively corresponding adjacent rows of the plurality of pixel circuits. The plurality of write scanning lines may be each connected to ones of the plurality of pixel circuits that may be disposed in a corresponding row of pixel circuits. The plurality of signal lines may be each connected to ones of the plurality of pixel circuits that may be disposed in a corresponding column of pixel circuits. The plurality of pixel circuits may be grouped into drive units each comprising four contiguous rows of pixel circuits that may be connected to a corresponding unit power supply line, which may be made up of two of the plurality of power supply lines configured as a common line. Each of the drive units may include two unit write scanning lines that each comprise two of the plurality of write scanning lines configured as a common line, and each unit write scanning line corresponds to at least one of the display colors and may be connected to all of the pixel circuits that correspond to any of the display colors to which the respective unit write scanning line corresponds and that may be included in the drive unit to which the respective unit write scanning line belongs.

Further, in the second exemplary display unit described above, for each of the plurality of pixel circuits included in the given one of the drive units, the first transistors of those pixel circuits connected to a same unit write scanning line as each other may be disposed in a same layout orientation as each other.

Further, in the second exemplary display unit described above, for each of the plurality of pixel circuits included in the given one of the drive units, the second transistors of those pixel circuits connected to a same unit write scanning line as each other may be disposed in a same layout orientation as each other.

Further, the second exemplary display unit described above may also include a drive control section configured to cause the plurality of pixel circuits to display image frames corresponding to input image data by control driving of the plurality of write scanning lines, the plurality of signal lines, and the plurality of power supply lines. The plurality of pixel circuits may be configured to perform, under control of the drive control section, a threshold correction operation that results in storing a threshold voltage of the second transistor of the respective one of the plurality of pixel circuit in the capacitor of the respective one of the plurality of pixel circuit. The drive control section may be configured to cause each of the plurality of pixel circuits included in the given one of the drive units to perform the threshold correction operation simultaneously during a given image frame period.

Further, in the second exemplary display unit described above the drive control section may be configured to cause each of the plurality of pixel circuits included in the given one of the drive units to perform the threshold correction operation by causing the first transistor of the respective pixel circuit to be in a conductive state while a reference potential is carried on the signal line connected to the respective pixel circuit and while a drive voltage is applied to the second transistor of the respective pixel circuit.

Further, in the second exemplary display unit described above the drive control section may be configured to cause the plurality of pixel circuits to perform a signal writing operation of sampling a video signal potential by placing the first transistor of the respective pixel circuit in a conductive state while a video signal potential is applied to the signal line connected to the respective pixel circuit. The signal writing operation may be performed during the given image frame period simultaneously for those of the plurality of pixel circuits connected to a same unit write scanning line. For pixel circuits connected to different unit write scanning lines from each other, the signal writing operation may be performed during the given image frame period at different respective timings.

Further, in the second exemplary display unit described above the display colors may include red, green, blue, and white.

BRIEF DESCRIPTION OF THE DRAWINGS

FIG. 7 is a diagram illustrating an example of voltages applied to the DTLs in FIG. 3 and FIG. 4.

FIG. 21A is a front view of an application 5 in an open state;

FIG. 21B is a side view of the application 5 in the open state;

FIG. 21C is a front view of the application 5 in a closed state;

FIG. 21D is a left side view of the application 5 in the closed state;

FIG. 21E is a right side view of the application 5 in the closed state;

FIG. 21F is a top view of the application 5 in the closed state; and

FIG. 21G is a bottom view of the application 5 in the closed state.

DETAILED DESCRIPTION OF EMBODIMENTS

In the following, detailed descriptions will be given of modes for carrying out the disclosure with reference to the drawings. In this regard, the descriptions will be given in the following order.

1. Embodiment (display apparatus)
2. Variations (display apparatuses)
3. Applications (electronic systems)

1. Embodiment

Configuration

Figure 1:
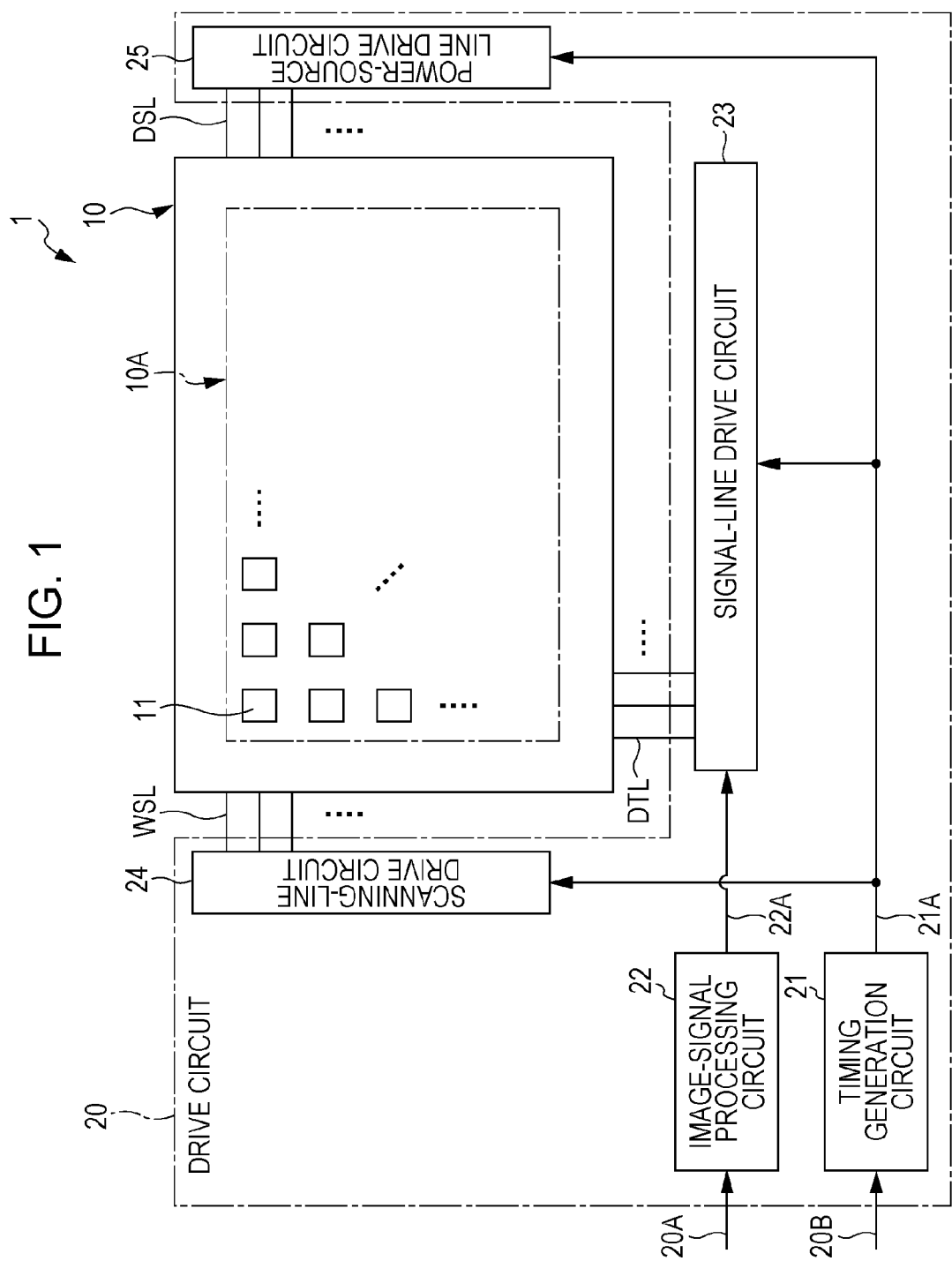
FIG. 1 is a schematic configuration diagram of a display apparatus according to an embodiment of the present technique.

FIG. 1 illustrates a schematic configuration of a display apparatus 1 according to an embodiment of the present technique. The display apparatus 1 includes a display panel 10, and a drive circuit 20 which drives the display panel 10 on the basis of an image signal 20A input from the outside, and a synchronization signal 20B. The drive circuit 20 includes, for example, a timing generation circuit 21, an image-signal processing circuit 22, a signal-line drive circuit 23, a scanning-line drive circuit 24, and a power-source line drive circuit 25.

Display Panel 10

The display panel 10 includes a plurality of pixels 11 disposed on all over a display area 10A of the display panel 10 in a matrix state. In the display panel 10, each pixel 11 is driven by the drive circuit 20 by active matrix addressing so that an image is displayed on the basis of the image signal 20A that is input from the outside.

Figure 2:
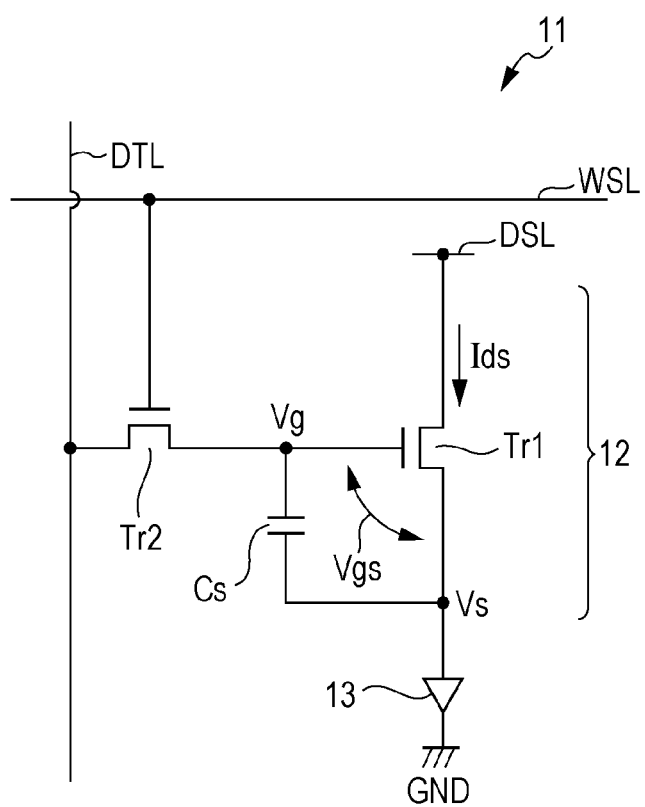
FIG. 2 is a diagram illustrating an example of a circuit configuration of each pixel (sub-pixel)

FIG. 2 illustrates an example of a circuit configuration of the pixel 11. Each pixel 11 includes a pixel circuit 12, and an organic EL element 13, for example. The organic EL element 13 has a configuration in which an anode electrode, an organic layer, and a cathode electrode are laminated in sequence, for example. The pixel circuit 12 includes, for example, a drive transistor Tr1, a write transistor Tr2, and a holding capacitor Cs, and has a 2Tr1C circuit configuration. The write transistor Tr2 controls application of a signal voltage in accordance with the image signal to the gate of the drive transistor Tr1. Specifically, the write transistor Tr2 samples a voltage of a signal line DTL described later, and writes on the gate of the drive transistor Tr1. The drive transistor Tr1 drives the organic EL element 13, and is connected to the organic EL element 13 in series. The drive transistor Tr1 controls a current flowing through the organic EL element 13 in accordance with the voltage written by the write transistor Tr2. The holding capacitor Cs holds a predetermined voltage between the gate and the source of the drive transistor Tr1. In this regard, the pixel circuit 12 may have a circuit configuration in which various capacitors and transistors are added to the 2Tr1C described above, or may have a circuit configuration different from the 2Tr1C described above.

The drive transistor Tr1 and the write transistor Tr2 are formed by, for example, an n-channel MOS-type thin film transistor (TFT). In this regard, the types of TFT are not limited in particular, and may be an inverted-staggered structure (a so-called bottom gate type), for example, or may be a staggered structure (top gate type). Also, the drive transistor Tr1 and the write transistor Tr2 may be formed by a p-channel MOS-type TFT.

The display panel 10 includes a plurality of scanning lines WSL extending in the row direction, a plurality of signal lines DTL extending in the column direction, and a plurality of power source lines DSL extending in the row direction. The scanning lines WSL are used for selecting each pixel 11. The signal lines DTL are used for supplying a signal voltage in accordance with an image signal to each pixel 11. The power source lines DSL are used for supplying a drive current to each pixel 11. The pixel 11 is disposed in the vicinity of an intersection between each of the signal lines DTL and each of the scanning lines WSL. Each of the signal lines DTL is connected to an output terminal (not illustrated in the figure) of the signal-line drive circuit 23 described later, and the source or the drain of the write transistor Tr2. Each of the scanning lines WSL is connected to an output terminal (not illustrated in the figure) of the scanning-line drive circuit 24 described later, and the gate of the write transistor Tr2. Each of the power source lines DSL is connected to an output terminal (not illustrated in the figure) of the power source that outputs a fixed voltage, and the source or the drain of the drive transistor Tr1.

The gate of the write transistor Tr2 is connected to the scanning line WSL. The source or the drain of the write transistor Tr2 is connected to the signal line DTL, and out of the source and the drain of the write transistor Tr2, an unconnected terminal to the signal line DTL is connected to the gate of the drive transistor Tr1. The source or the drain of the drive transistor Tr1 is connected to the power source line DSL, and out of the source and the drain of the drive transistor Tr1, an unconnected terminal to the power source line DSL is connected to the anode of the organic EL element 13. One end of the holding capacitor Cs is connected to the gate of the drive transistor Tr1, and the other end of the holding capacitor Cs is connected to the source (a terminal of the organic EL element 13 side in FIG. 2) of the drive transistor Tr1. That is to say, the holding capacitor Cs is inserted between the gate and the source of the drive transistor Tr1. In this regard, the organic EL element 13 has an element capacitor Coled (not illustrated in the figure).

Further, as illustrated in FIG. 2, the display panel 10 includes a ground line GND connected to the cathode of the organic EL element 13. The ground line GND is connected to an external circuit (not illustrated in FIG. 2), which has ground potential. The ground line GND is a sheet electrode formed all over the display area 10A, for example. In this regard, the ground line GND may be a strip-shaped electrode formed like a strip paper corresponding to a pixel row or a pixel column. The display panel 10 further includes a frame area in which an image is not displayed, for example, on the periphery of the display area 10A. The frame area is covered with a light-shielding member, for example.

Figure 3:
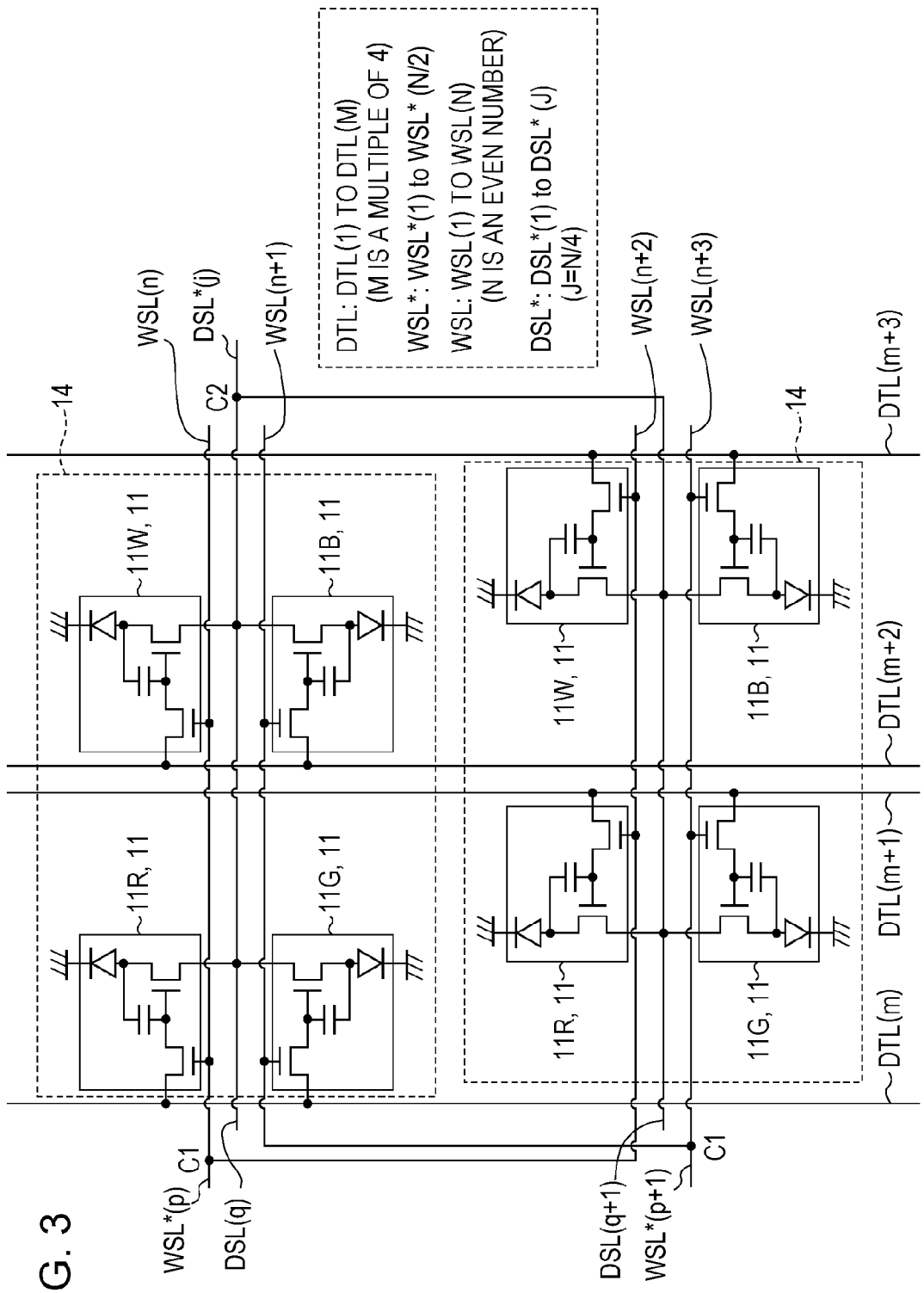
FIG. 3 is a diagram illustrating an example of a circuit configuration of two display pixels adjacent to each other in a column direction.
Figure 4:
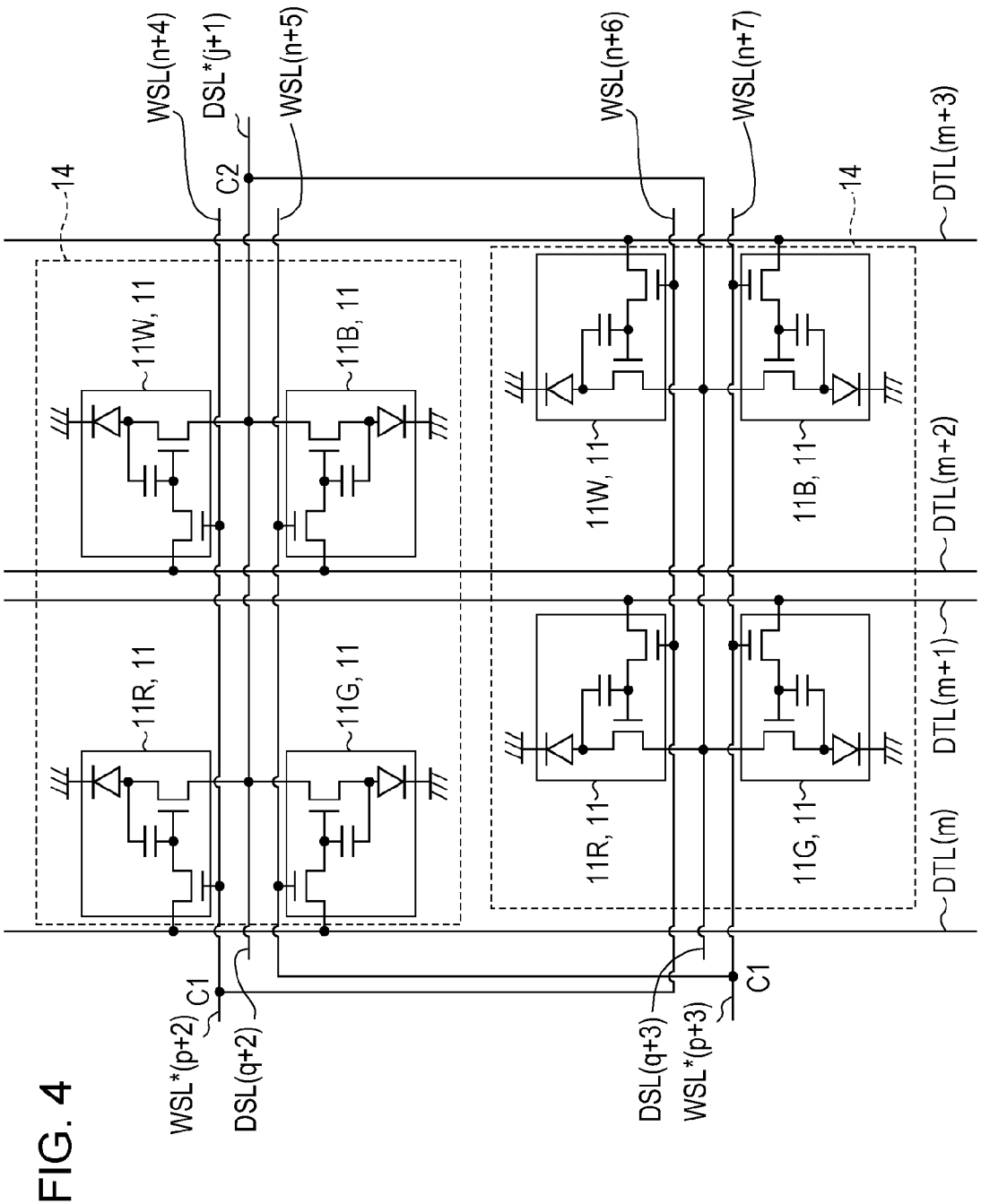
FIG. 4 is a diagram illustrating another example of a circuit configuration of two display pixels adjacent to each other in a column direction.

FIG. 3 and FIG. 4 illustrate examples of a circuit configuration, with each of the figures including two display pixel units 14 (described later) that are adjacent to each other in the column direction. FIG. 3 illustrates an example of a circuit configuration of a first display pixel unit 14 including pixels 11 from the n-th and the (n+1)-th pixel rows, and a second display pixel unit 14 including pixels 11 from the (n+2)-th and (n+3)-th pixel rows (1≤n≤N, N is a total number (even number) of pixel rows). FIG. 4 illustrates an example of a circuit configuration of a third display pixel unit 14 including pixels 11 from the (n+4)-th and the (n+5)-th pixel rows, and a fourth display pixel unit 14 including pixels 11 from the (n+6)-th and (n+7)-th pixel rows. Here, the pixel row indicates a line formed by a plurality of pixels 11 disposed along a line in the row direction, and corresponds to a sub-pixel row. On the other hand, the display pixel unit row described later indicates a line formed by a plurality of display pixel units 14 disposed along a line in the row direction. In this exemplary illustration, each display pixel unit row includes two pixel rows, although other configurations are certainly within the scope of this disclosure. Hereinafter, in order not to confuse a pixel row with a display pixel unit row, a pixel row is called a sub-pixel row.

The circuit layout of each display pixel unit 14 in the p-th display pixel unit row and the (p+2)-th display pixel unit row are similar to each other. Further, the circuit layout of each display pixel unit 14 in the (p+1)-th display pixel unit row and the (p+3)-th display pixel unit row are similar to each other. In the following, in order not to duplicate the descriptions, the descriptions will be omitted on the circuit layout of the (p+2)-th display pixel unit row and (p+3)-th display pixel unit row.

Each pixel 11 corresponds to a point of a minimum unit included in a screen on the display panel 10. The display panel 10 is a color display panel, and the pixel 11 corresponds to a sub-pixel that emits a single color, such as red, green, blue, or white, and so on, for example. In this regard, the pixel 11 may correspond to a sub-pixel that emits a single color, such as red, green, blue, or yellow, and so on, for example. The display pixel unit 14 is a grouping of adjacent pixels 11—one each of the colors utilized in the display panel.

In the present embodiment, the display pixel unit 14 includes four pixels 11 having different luminescent colors with one another. That is to say, the number of kinds of the luminescent colors utilized in the display panel ("display colors") is four, and the number of pixels 11 included in each display pixel unit 14 is four, one each of the display colors. The four pixels 11 included in the display pixel unit 14 are, for example, a pixel 11R, which emits red light, a pixel 11G, which emits green light, a pixel 11B, which emits blue light, and a pixel 11W, which emits white light. The four pixels 11 included in the display pixel unit 14 are disposed in a so-called four-square arrangement, that is to say, in a 2×2 matrix. Also, in each display pixel unit 14, the four pixels 11 have a common color arrangement. For example, as illustrated in FIG. 3, the pixel 11R is disposed in the upper left in the four-square arrangement, the pixel 11G is disposed in the lower left in the four-square arrangement, the pixel 11B is disposed in the lower right in the four-square arrangement, and the pixel 11W is disposed in the upper right in the four-square arrangement.

The sub-pixel rows are grouped into drive units that each include K sub-pixel rows (K≥4). Each drive unit also includes L unit write scanning lines WSL*, where each unit write scanning line WSL* includes R of the write scanning lines WSL configured as a common line, such that K=L·R. The number of display pixel rows included in one unit is also L, where L is two or more, and not greater than the number of kinds of luminescent colors. Specifically, assuming two display pixel rows to be in one unit (i.e., L=2), two of the plurality of unit write scanning lines WSL* are assigned for each one unit. Accordingly, in the example shown in FIGS. 3 and 4 the number of display pixel rows included in one unit is two, and the number of unit write scanning lines WSL* included in one unit is also two. The total number of unit write scanning lines WSL* in the entire display is equal to the total number of display pixel rows in the entire display, and is N/R, where N is the total number of sub-pixel rows and R is the number of write scanning lines WSL included in a single unit write scanning line WSL*. In this regard, n in FIG. 3 is a positive integer from 1 to N, and WSL(n) in FIG. 3 means the n-th write scanning line WSL, while p is a positive integer from 1 to N/R and WSL*(p) means the p-th unit write scanning line WSL*.

Each unit write scanning line WSL* is connected to all of the pixels 11 in its respective drive unit that have a particular luminescent color. Specifically, for example, in the drive unit shown in FIG. 3, of the two unit write scanning lines WSL*(p) and WSL*(p+1) included in the one drive unit, the unit write scanning line WSL*(p) is connected to all of the red pixels (pixels 11R) and to all of the white pixels (pixels 11W) included in the drive unit, and the unit write scanning line WSL*(p+1) is connected to all of the green pixels (pixels 11G) and all of the blue pixels (pixels 11B) included in the drive unit. In two display pixel units 14 of one drive unit having different rows with each other and adjacent with each other in the column direction, the arrangements of luminescent colors of the pixels 11 that share a unit write scanning line WSL* are the same with respect each other. For example, in FIG. 3, in each display pixel unit 14 the red and white pixels 11 are connected to the same unit write scanning line WSL*(p), and the arrangement of the red and white pixels 11 is the same in each display pixel unit 14.

Each of the unit write scanning lines WSL* includes R write scanning lines WSL, which are configured as a common line. For example, in FIGS. 3 and 4, the unit write scanning lines WSL* (WSL*(p) to WSL*(p+3)) each includes R branches, each comprising a write scanning line WSL (WSL (n) to WSL(n+7)). The number of write scanning lines WSL per unit write scanning line WSL* (i.e., R) is the same as the number of sub-pixel rows included in one display pixel row, and is greater than or equal to two and less than or equal to the number of display colors. In the exemplary illustration, R=2, and one of the branches is assigned to an upper sub-pixel row in each display pixel unit row in one drive unit. The one of the branches is connected to a plurality of pixels 11 having the same luminescent color in one display unit. The other of the branches is assigned to a lower sub-pixel row in each display pixel unit row in one display unit. The other of the branches has a different luminescent color from the luminescent color of the pixel 11 connected to the one of the branches, and is connected to a plurality of pixels 11 having the same luminescent color in one display unit. In each of the unit write scanning lines WSL*, each second branch is connected with each other in the display panel 10. A connection point C1 of the branches may be in the display area 10A, or may be in the periphery of the display area 10A (frame area). Also, when viewed from a normal line of the display panel 10, each of the unit write scanning lines WSL* intersects the other of the scanning lines WSL in the same drive unit at some point. The second branch of each unit write scanning line WSL* cuts across a center of the four-square arrangement. The gate electrode 14A of the write transistor Tr2 is connected to the second branch.

One of the plurality of unit power source lines DSL* is assigned to each one drive unit. Accordingly, the number of unit power source lines DSL included in one drive unit is 1. The total number of the unit power source lines DSL* in the entire display panel is J (J=N/K). In the exemplary illustration, K=4, and thus J=N/4. In this regard, j in FIG. 3 is a positive integer from 1 to N/4, and DSL*(j) in FIG. 3 means the j-th unit power source line DSL*. Each of the unit power source lines DSL* is connected to all the pixels 11 in its respective drive unit. Specifically, one unit power source line DSL* included in one drive unit is connected to all the pixels 11 (11R, 11G, 11B, and 11W) included in one drive unit.

Each unit power source line DSL* is made up of K/2 power source lines DSL (one for every two sub-pixel rows) that are configured as a common line. For example, in FIG. 3 and FIG. 4, each of the unit power source lines DSL* (DSL*(j), DSL* (j+1)) includes two branches (power source lines DSL). Each branch (power source line DSL) of each of the unit power source lines DSL* is connected with each other in the display panel 10. A connection point C2 of the branches may be in the display area 10A, or may be in the periphery of the display area 10A (frame area). In this manner, by providing each of the unit write scanning lines WSL* and each of the unit power source lines DSL* with branches, it is possible to widen the interval of each of the scanning lines WSL* and the interval of each of the power source lines DSL* outside of the display area. As a result, wiring layout becomes easy. The branches of each of the unit power source lines DSL* cut across a center of the four-square arrangement.

While the branched configuration of the unit power source lines DSL* and unit write scanning lines WSL* described in the illustrative example, the disclosure is not limited to that specific configuration. In particular, in this disclosure and the appended claims, multiple wirings are "configured as a common line" when those wirings have the same voltages applied thereto at the same timings. This might be the case, for example, because the wirings are directly connected to each other (as in the branched configuration discussed above). However, multiple wirings that are "configured as a common line" do not have to be directly connected to each other as long as the same voltages are applied thereto at the same timings. For example, a driving circuit may be configured to apply the same voltages to plural wirings at the same timings, in which case the plural wirings would be "configured as a common line."

Two of the plurality of signal lines DTL are assigned to every display pixel unit 14. In the two signal lines DTL assigned for each display pixel unit 14, one of the signal lines DTL is connected to the pixels 11 having two kinds of luminescent colors and not sharing the unit write scanning line WSL*, and the other of the signal lines DTL is connected to the pixels 11 having the remaining two kinds of luminescent colors. In the following, among the plurality of display pixel unit 14 included in the p-th and the (p+1)-th display pixel unit rows, attention is given to the two display pixel units 14 adjacent with each other in the column direction, and a description will be given of the above connection modes. In this regard, the two display pixel unit 14 described above have different display pixel rows in one unit, and correspond to two display pixel units 14 adjacent with each other in the column direction.

The two signal lines DTL(m) and DTL(m+2) are assigned to the display pixel units 14 included in the p-th display pixel unit row out of the two display pixels 14. Further, the two signal lines DTL(m+2) and DTL(m+3) are assigned to the display pixel units 14 included in the (p+1)-th display pixel unit row out of the two display pixels 14. That is to say, in the two display pixel units 14 having different rows and adjacent with each other in one unit, two even-numbered signal lines DTL(m) and DTL(m+2) are assigned to one of the display pixels 14, and two odd-numbered signal lines DTL(m+1) and DTL(m+3) are assigned to the other of the display pixels 14. Thereby, the total number of the signal lines DTL is kept to a minimum.

Four lines of the plurality of signal line DTL are assigned to two display pixel units 14 adjacent with each other in the column direction. Accordingly, the total number of signal lines DTL is M (M is a multiple of 4), where M/2 is the total number of columns of pixels 11. In FIG. 3, m is a positive integer from 1 to M−4, and if m is not 1, m is a number corresponding to (a multiple of 4+1). Accordingly, DTL(m) in FIG. 3 means the m-th signal line DTL. For example, the four signal line DTL(m), DTL(m+1), DTL(m+2), and DTL(m+3) are assigned to the two display pixel units 14 adjacent with each other in the column direction. The four signal lines DTL(m), DTL(m+1), DTL(m+2), and DTL(m+3) are disposed in parallel in this order in the row direction. In each display pixel unit 14, out of the four pixels 11, the two pixels 11 on the left side are sandwiched by the signal line DTL(m) and the signal line DTL(m+1) in the row direction. Also, in each display pixel unit 14, out of the four pixels 11, the two pixels 11 on the right side are sandwiched by the signal line DTL(m+2) and the signal line DTL(m+3) in the row direction.

Also, in two display pixel units 14 having different display pixel rows with each other in one unit and adjacent with each other in the column direction, two pixels 11 having the same luminescent color with each other are disposed between the two common signal lines DTL. Specifically, in two display pixel units 14 having different display pixel rows with each other in one unit and adjacent with each other in the column direction, two pixels 11R are disposed between the two signal lines DTL(m) and DTL(m+1). In the same manner, in two display pixel units 14 having different display pixel rows with each other in one unit and adjacent with each other in the column direction, two pixels 11G are disposed between the two signal lines DTL(m) and DTL(m+1). Also, in two display pixel units 14 having different rows with each other in one unit and adjacent with each other in the column direction, two pixels 11B are disposed between the two signal lines DTL(m+2) and DTL(m+3). Also, in two display pixel units 14 having different rows with each other in one unit and adjacent with each other in the column direction, two pixels 11W are disposed between the two signal lines DTL(m+2) and DTL(m+3). In this regard, the signal line DTL(m) or DTL(m+2) corresponds to a specific example of the "first signal line" or the "third signal line" according to the present technique, respectively. Also, the signal line DTL(m+1) or DTL(m+3) corresponds to a specific example of the "second signal line" or the "fourth signal line", respectively.

The above-described two signal lines DTL(m) and DTL(m+2) are connected to pixels 11 having two kinds of luminescent colors and not individually sharing a unit write scanning line WSL* with each other. Specifically, the signal line DTL(m) is connected to the pixels 11R and 11G having two kinds of luminescent colors and not individually sharing a unit write scanning line WSL* with each other. The signal line DTL(m+2) is connected to the pixels 11B and 11W having two kinds of luminescent colors and not individually sharing a unit write scanning line WSL* with each other. Further, out of the above-described two display pixel unitss 14, the two signal lines DTL(m+1) and DTL(m+3) are assigned to the display pixel unit 14 included in the (p+1)-th pixel row. The two signal lines DTL(m+1) and DTL(m+3) are connected to the pixels 11 having two kinds of luminescent colors and not individually sharing a unit write scanning line WSL* with each other. Specifically, the signal line DTL(m+1) is connected to the pixels 11R and 11G having the two kinds of luminescent colors, and not individually sharing a unit write scanning line WSL*, and the signal line DTL(m+3) is connected to pixels 11B and 11W having the remaining two kinds of luminescent colors.

Figure 5:
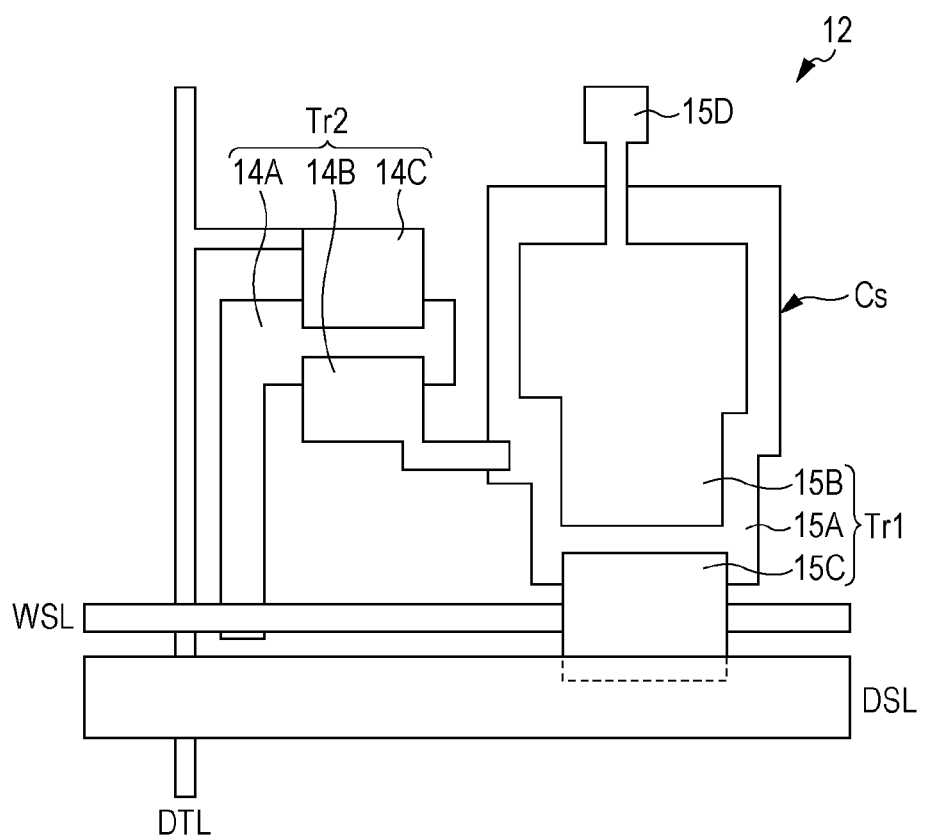
FIG. 5 is a diagram illustrating an example of a layout of a pixel circuit.

FIG. 5 illustrates an example of a layout of the pixel circuit 12. Specifically, FIG. 5 illustrates an example of a layout of the pixel circuit 12 of pixels 11R and 11W. As described above, the pixel circuit 12 includes, for example, the drive transistor Tr1, the write transistor Tr2, and the holding capacitor Cs.

The write transistor Tr2 includes a gate electrode 14A, a source electrode 14B, and a drain electrode 14C, for example. The source electrode 14B and the drain electrode 14C are disposed at positions opposed to each other in a plane with sandwiching a right over section of the gate electrode 14A. The source electrode 14B is connected to the signal line DTL. For example, as illustrated in FIG. 5, the source electrode 14B is connected to a branch (first branch) from the main line of the signal line DTL. The first branch extends in a direction intersecting the extending direction of the main line of the signal line DTL. The gate electrode 14A is connected to the scanning line WSL. The gate electrode 14A extends from right under the gap between the source electrode 14B and the drain electrode 14C toward the scanning line WSL. The drain electrode 14C is connected to a gate electrode 15A of the drive transistor Tr1 described later, and the holding capacitor Cs.

In the write transistor Tr2, the disposition direction of the gate electrode 14A, the source electrode 14B, and the drain electrode 14C is parallel to the extending direction of the signal line DTL in a plane. In this regard, in FIG. 5, an example is illustrated in which the gate electrode 14A, the source electrode 14B, and the drain electrode 14C are disposed in order of the drain electrode 14C, the gate electrode 14A, and the source electrode 14B from the scanning line WSL side. In this regard, the gate electrode 14A, the source electrode 14B, and the drain electrode 14C are not illustrated in FIG. 5, but may be disposed in order of the source electrode 14B, the gate electrode 14A, and the drain electrode 14C from the scanning line WSL side.

The drive transistor Tr1 includes the gate electrode 15A, the source electrode 15B, and the drain electrode 15C, for example. The source electrode 15B and the drain electrode 15C are disposed at positions opposed to each other in a plane with sandwiching a right over section of the gate electrode 15A. The source electrode 15B is connected to the anode of the organic EL element 13 through a contact 15D. The source electrode 15B is coupled with one of the electrodes of the holding capacitor Cs. The gate electrode 15A is connected to the drain electrode 14C, and further, is coupled with one of the electrodes of the holding capacitor Cs. The drain electrode 15C is connected to the power source line DTL.

In the drive transistor Tr1, the disposition direction of the gate electrode 15A, the source electrode 15B, and the drain electrode 15C is parallel to the extending direction of the signal line DTL in a plane. In this regard, in FIG. 5, an example in which the gate electrode 15A, the source electrode 15B, and the drain electrode 15C are disposed in order of the drain electrode 15C, the gate electrode 15A, and the source electrode 15B from the scanning line WSL side. Also, in FIG. 5, both in the drive transistor Tr1 and the write transistor Tr2, the disposition direction of the gate, the source, and the drain is in parallel to the extending direction of the signal line DTL. That is to say, the disposition direction of the gate electrode, the source electrode, and the drain electrode is the same in the write transistor Tr2 in the pixel circuit 12 included in the display pixel unit 14 of one of the pixel rows in one unit, the drive transistor Tr1 in the pixel circuit 12 included in the display pixel unit 14 of one of the pixel rows in one unit, the write transistor Tr2 in the pixel circuit 12 included in the display pixel unit 14 of the other of the pixel rows in one unit, and the drive transistor Tr1 in the pixel circuit 12 included in the display pixel unit 14 of the other of the pixel rows in one unit, with each other.

Figure 6:
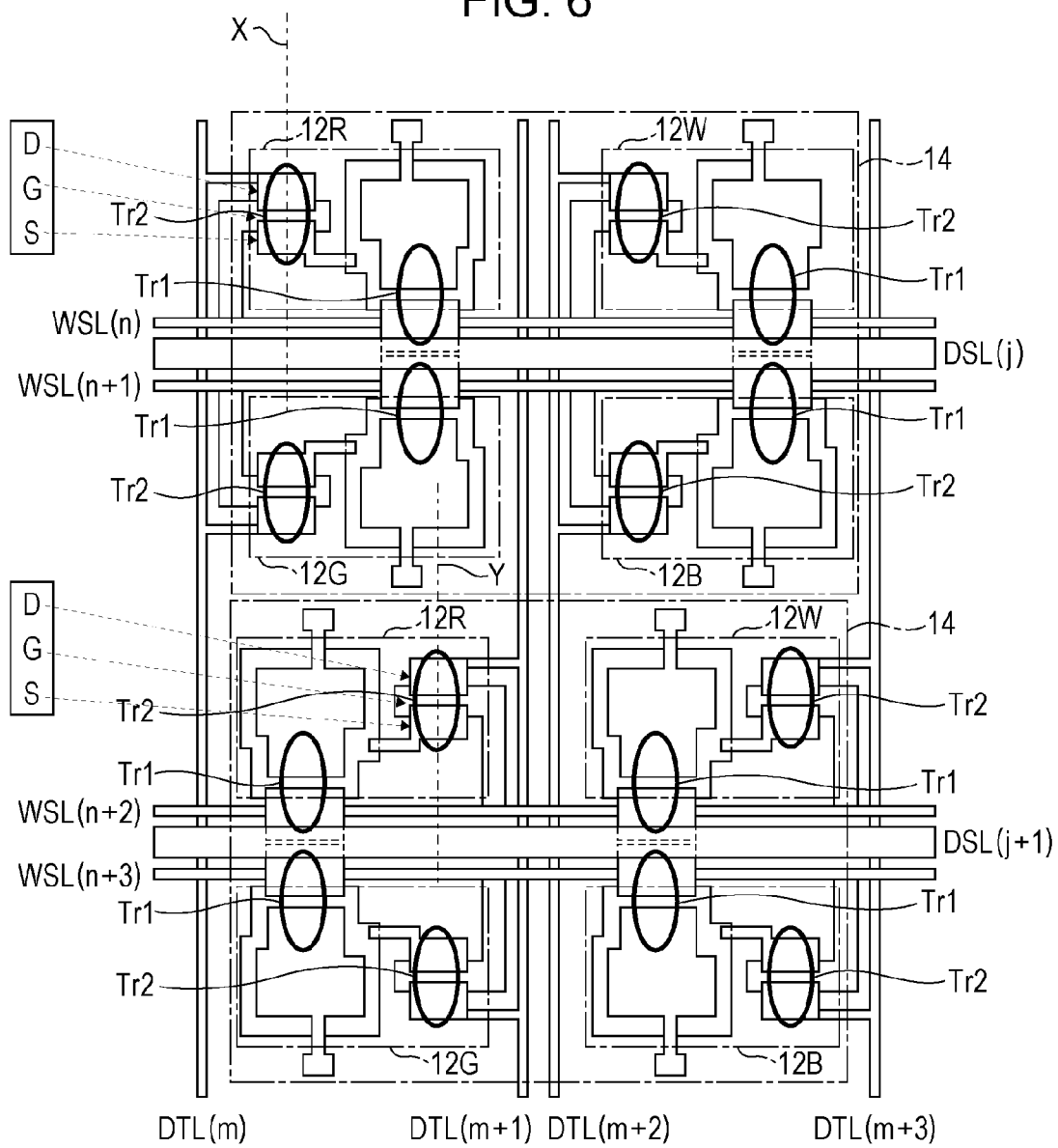
FIG. 6 is a diagram illustrating an example of a layout of each pixel circuit in two display pixels adjacent to each other in a column direction.

FIG. 6 is a diagram illustrating an example of a layout of each pixel circuit 12 in two display pixel units 14 adjacent to each other in the column direction. In the two display pixel units 14 having different rows in one drive unit and adjacent to each other, the layouts (in particular, the disposition of the gate (G), the source (S), and the drain (D)) of the write transistors Tr2 in the two pixels 11 having the same luminescent color with each other are the same. Specifically, in the two red pixel circuits 12R of the two adjacent display pixel units, the respective disposition directions of the gate electrode 14A, the source electrode 14B, and the drain electrode 14C of the write transistors Tr2 thereof are parallel to the extending direction of the signal line DTL in a plane and the respective orders of the electrodes thereof are also the same (e.g., D-G-S from top to bottom). The same is true for the two blue pixels, the two white pixels, and the two green pixels. For example, in the two red pixel circuits 12R, the gate electrode 14A, the source electrode 14B, and the drain electrode 14C of the write transistor Tr2 are disposed in a plane in order of the drain electrode 14C, the gate electrode 14A, and the source electrode 14B from top to bottom in the figure. However, although not illustrated in FIG. 6, in the two pixels 11, the gate electrode 14A, the source electrode 14B, and the drain electrode 14C of the write transistor Tr2 may be disposed in a plane in order of the source electrode 14B, the gate electrode 14A, and the drain electrode 14C from top to bottom.

Further, in the two display pixel units 14 having different rows in one drive unit and adjacent to each other, the layouts (in particular, the disposition of the gate (G), the source (S), and the drain (D)) of the drive transistor Tr1 in the two pixels 11 having the same luminescent color with each other are the same. Specifically, in the two pixels 11, the gate electrode 15A, the source electrode 15B, and the drain electrode 15C of the drive transistor Tr1 are disposed in the direction parallel to the extending direction of the signal line DTL. For example, in the two pixels 11, the gate electrode 15A, the source electrode 15B, and the drain electrode 15C of the drive transistor Tr1 are disposed in order of the drain electrode 15C, the gate electrode 15A, and the source electrode 15B from top to bottom in the figure.

In this disclosure and the appended claims, two transistors have "a same layout orientation as each other" when, viewed from a given perspective (for example, a perspective above the substrate upon which the transistors are formed), both the respective directions and the respective orders in which the drain, gate, and source of the two transistors are laid out are the same.

The respective directions in which the drain, gate, and source of two transistors are laid out are the same when a line that passes through a drain region and a source region of one of the transistors is approximately parallel to a line that passes through a drain region and a source region of the other one of the transistors. For example, the aforementioned lines may pass approximately through the respective geometric centers of the planar shapes corresponding to the drain regions and a source regions of the transistors in a cross section parallel to the substrate upon which the transistors are formed. For example, in FIG. 6 a line X passes approximately through the respective geometric centers of the drain region and source region of the transistor Tr2 of the red pixel circuit 12R in row n and column m (hereinafter "pixel circuit (n,m)"). Similarly, in FIG. 6 a line Y passes approximately through the respective geometric centers of the drain region and source region of the transistor Tr2 of the red pixel circuit 12R in row n+2 and column m (hereinafter "pixel circuit (n+2,m)"). The lines X and Y in FIG. 6 are approximately parallel to each other, and, therefore, the respective drains, gates, and sources of transistors Tr2 of the pixel circuit (n,m) and the pixel circuit (n+2,m) are laid out in the same direction.

The respective orders in which the drain, gate, and source of the two transistors are laid out are the same when the drain, gate, and source of each of the two transistors are encountered in the same order when moving along the aforementioned lines in the same direction. For example, in FIG. 6 the drain, gate, and source of the transistors Tr2 of the pixel circuit (n,m) and the pixel circuit (n+2,m) are encountered in the order of first drain (D), second gate (G), and third source (S) when moving along lines X and Y in a downward direction in the figure, and thus the respective drains, gates, and sources of transistors Tr2 of the pixel circuit (n,m) and the pixel circuit (n+2,m) are laid out in the same order. As a contrasting example, in FIG. 13 the drain, gate, and source of the transistors Tr2 of the pixel circuit (n,m) and the pixel circuit (n+2,m) are not laid out in the same order because they are encountered in different orders when moving in the same direction (e.g., when moving left to right in the figure the respective orders are: D-G-S for pixel circuit (n,m) and S-G-D for pixel circuit (n+2,m)).

As used in this disclosure and the appended claims, the phrase "a same layout orientation as each other" does not imply any restrictions other than those discussed in the definition above unless specifically noted otherwise. Thus, for example, the phrase "a same layout orientation as each other" as used herein does not imply anything about the relative sizes of the transistors, about the relative shapes of the transistors, about locations of wirings connected to the transistors, about the structural configuration of the transistors (e.g., top-gate structure versus bottom-gate structure, single-gate structure versus multi-gate structure, and so on), etc. Further, the particular orientations illustrated (e.g., vertical, horizontal, etc.) are not limiting, and any orientations can be used as long as the orientations for the particular recited transistors are the same.

Furthermore, one of ordinary skill in the art would understand that whether an electrode of a transistor is considered a source or a drain electrode may depend on the voltages applied thereto in driving the transistor. For example, in some circumstances an electrode normally functioning as a source electrode may function as a drain electrode if applied voltages are reversed. Accordingly, in determining whether two transistors have the same layout orientation, it must be assumed that the same driving states are applied to the transistors at the time their orientations are considered. For example, if the orientations of two driving transistors Tr1 are considered, then it would be appropriate to determine the locations of the respective electrodes thereof while a driving voltage is applied to both transistors, but inappropriate to determine the locations of the respective electrodes thereof while a drive voltage is applied to one of the transistors and a reverse-bias voltage is applied to the other transistor.

Drive Circuit 20

Next, a description will be given of the drive circuit 20. As described above, the drive circuit 20 includes, for example, a timing generation circuit 21, an image-signal processing circuit 22, a signal-line drive circuit 23, a scanning-line drive circuit 24, and a power-source line drive circuit 25. The timing generation circuit 21 performs control so that each circuit in the drive circuit 20 operates together. For example, the timing generation circuit 21 outputs a control signal 21A to the above-described each circuit in accordance with (in synchronism with) a synchronization signal 20B that is input from the outside.

The image-signal processing circuit 22 performs predetermined correction, for example, on the digital image signal 20A input from the outside, and outputs the image signal 22A obtained thereby to the signal-line drive circuit 23. For the predetermined correction, gamma correction, overdrive correction, and so on are given, for example.

The signal-line drive circuit 23 applies, for example, an analog signal voltage corresponding to the image signal 22A that is input from the image-signal processing circuit 22 in accordance with (in synchronism with) input of the control signal 21A on each signal line DTL. The signal-line drive circuit 23 is capable of outputting two kinds of voltages (Vofs and Vsig), for example. Specifically, the signal-line drive circuit 23 supplies two kinds of voltages (Vofs and Vsig) to the pixel 11 selected by the scanning-line drive circuit 24 through the signal line DTL.

FIG. 7 illustrates an example of signal voltages V(p), V(p+1), V(p+2), and V(p+3) applied in accordance with scanning of the unit write scanning lines WSL* to the four signal lines DTL (DTL(m), DTL(m+1), DTL(m+2), and DTL(m+3), which are connected to the four display pixel units 14 shown in FIGS. 3 and 4, which are disposed adjacent to each other in the column direction in two drive units adjacent with each other in the column direction. The signal-line drive circuit 23 outputs the signal voltage V(p) in response to the selection of the unit write scanning line WSL*(p), and outputs the signal voltage V(p+1) in response to the selection of the unit write scanning line WSL*(p+1). In the same manner, the signal-line drive circuit 23 outputs the signal voltage V(p+1) in response to the selection of the unit write scanning line WSL*(p+2), and outputs the signal voltage V(p+3) in response to the selection of the unit write scanning line WSL*(p+3). Here, as described later, the scanning-line drive circuit 24 selects the unit write scanning lines WSL* in order of WSL*(p), WSL*(p+1), WSL*(p+2), and WSL*(p+3) at the time of writing the signal voltage. Accordingly, the signal line drive circuit 23 outputs the signal voltage Vsig in order of V(p), V(p+1), V(p+2), and V(p+3) at the time of writing the signal voltage.

As illustrated in FIG. 7, the signal-line drive circuit 23, for example, supplies, voltages Vsig to a plurality of pixels 11 simultaneously selected by the scanning-line drive circuit 24. In FIG. 7, the specific voltage Vsig intended for a specific sub-pixel 11 located in an n-th sub-pixel row and connected to an m-th signal line is indicated by Vsig(n, m). Thus, when the unit write scanning line WSL*(p) is scanned, the signal voltage V(p) is applied to the signal lines, where the voltage V(p) comprises voltages Vsig(n, m), Vsig(n+2, m+1), Vsig (n, m+2), Vsig(n+2, m+3), etc.

That is to say, when the unit write scanning line WSL*(p) is selected at the time of writing a signal, the signal-line drive circuit 23 outputs the voltages Vsig(n, m) and Vsig(n, m+2) corresponding to the n-th sub-pixel row to the even-numbered signal lines DTL(m) and DTL(m+2). At the same time, the signal-line drive circuit 23 outputs the voltages Vsig(n+2, m+1) and Vsig(n+2, m+3) corresponding to the (n+2)-th sub-pixel row to the odd-numbered signal lines DTL(m+1) and DTL(m+3). Also, when the unit write scanning line WSL*(p+1) is selected at the time of writing a signal, the signal-line drive circuit 23 outputs the voltages Vsig(n+1, m) and Vsig(n+1, m+2) corresponding to the (n+1)-th sub-pixel row to the even-numbered signal lines DTL(m) and DTL(m+2). At the same time, the signal-line drive circuit 23 outputs the voltages Vsig(n+3, m+1) and Vsig(n+3, m+3) corresponding to the (n+3)-th sub-pixel row to the odd-numbered signal lines DTL (m+1) and DTL(m+3). In this regard, the signal-line drive circuit 23 applies voltages to the (n+2)-th pixel row and the (n+3)-th pixel row in the same manner as the n-th pixel row and the (n+1)-th pixel row.

Vsig is a voltage value corresponding to the image signal 20A. Vofs is a certain voltage irrelevant to the image signal 20A. The minimum voltage of Vsig is a voltage value lower than Vofs, and the maximum voltage of Vsig is a voltage value higher than Vofs.

Among the plurality of pixels 11 selected simultaneously by the scanning-line drive circuit 24, the two pixels 11 disposed between the even-numbered signal line DTL(m) and the odd-numbered signal line DTL(m+1) have the same luminescent color with each other. In the same manner, among the plurality of pixels 11 selected simultaneously by the scanning-line drive circuit 24, the two pixels 11 disposed between the even-numbered signal line DTL(m+2) and the odd-numbered signal line DTL(m+3) have the same luminescent color with each other. Accordingly, when the unit write scanning line WSL*(p) is selected, the signal-line drive circuit 23 outputs voltages Vsig corresponding to pixels having the same luminescent color as each other to the signal lines DTL(m) and DTL(m+1). At the same time, the signal-line drive circuit 23 outputs voltages Vsig corresponding to pixels having the same luminescent color as each other to the signal lines DTL (m+2) and DTL(m+3). For example, when the unit write scanning line WSL*(p) is selected, the signal-line drive circuit 23 outputs voltages Vsig corresponding to the red pixels (pixels 11R) to the signal lines DTL(m) and DTL(m+1), and at the same time, outputs voltages Vsig corresponding to the white pixels (pixels 11W) to the signal lines DTL(m+2) and DTL(m+3).

The scanning-line drive circuit 24 selects a plurality of unit write scanning lines WSL* for each predetermined drive unit in sequence in response to (in synchronism with) input of the control signal 21A, for example. The scanning-line drive circuit 24 selects a plurality of unit write scanning lines WSL* in a predetermined sequence, for example, in response to (in synchronism with) input of the control signal 21A so as to perform Vth correction, writing of signal voltage Vsig, and μ correction in a desired sequence. Here, the Vth correction indicates correction operation for bringing the gate-source voltage Vgs of the drive transistor Tr1 close to the threshold voltage of the drive transistor. The writing of signal voltage Vsig indicates writing the signal voltage Vsig to the gate of the drive transistor Tr1 through the write transistor Tr2. The μ correction indicates correction operation of the voltage Vgs held between the gate and the source of the drive transistor Tr1 in accordance with the mobility μ of the drive transistor Tr1. Writing of the signal voltage Vsig and the μ correction may be performed at separate timing with each other. In the present embodiment, the scanning-line drive circuit 24 outputs one selection pulse to the unit write scanning line WSL* so as to perform writing of the signal voltage Vsig and the μ correction at the same time, (or in no time in succession).

Figure 9:
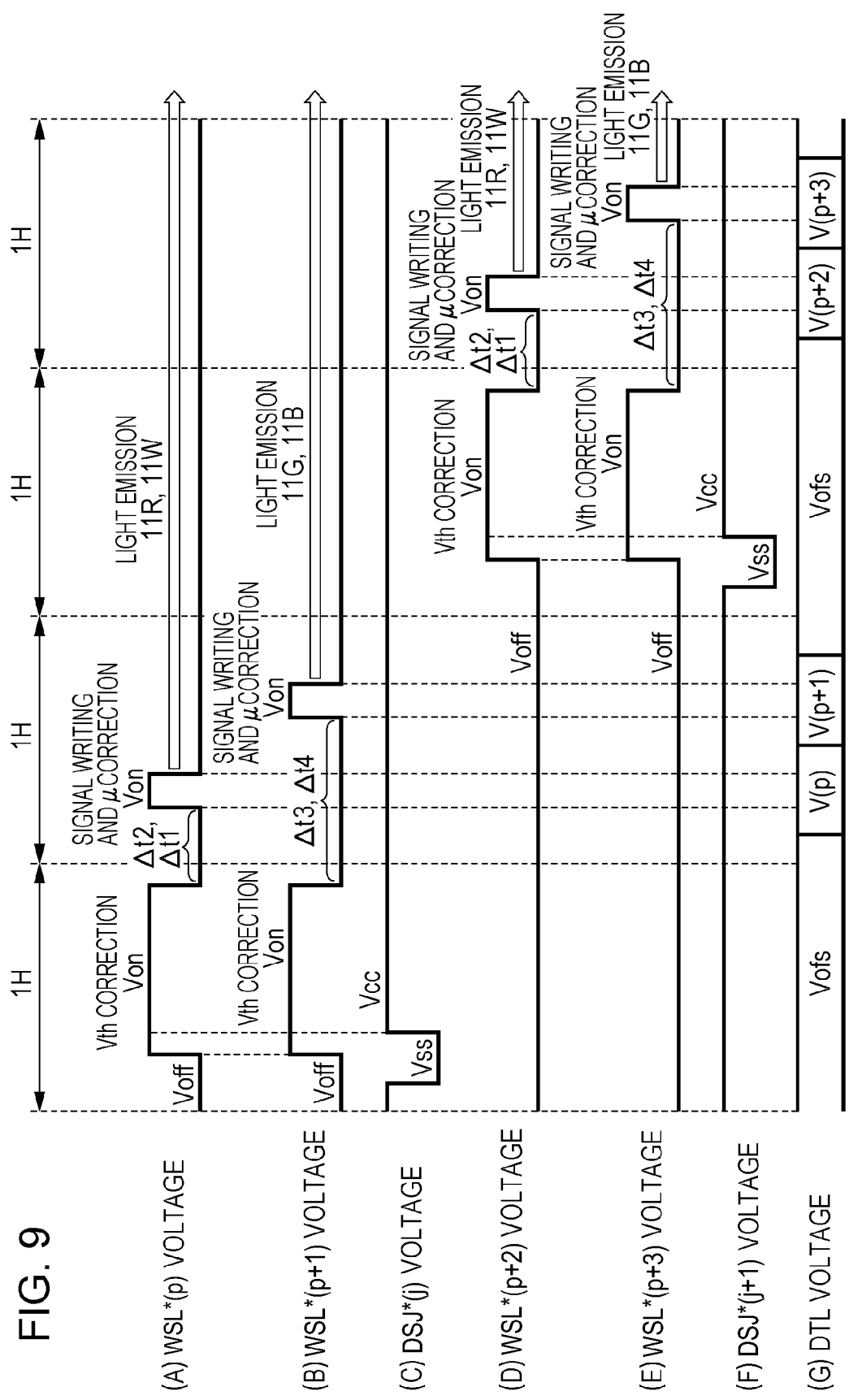
FIG. 9 is a waveform chart illustrating an example of changes with time in voltages applied to WSL, DSL, and DTL when attention is given to two pixels adjacent to each other in a column direction.

Incidentally, the drive circuit 20 performs the Vth correction and the signal writing for all of the drive units in sequence. Specifically, as illustrated in FIG. 9, the drive circuit 20 performs the Vth correction and the signal writing on the first drive unit (e.g., the pixels 11 connected to WSL*(p) and WSL*(p+1)), and then performs the Vth correction and the signal writing on the second drive unit adjacent to the first drive unit in the column direction (e.g., the pixels 11 connected to WSL*(p+2) and WSL*(p+3)). That is to say, the drive circuit 20 performs a series of operation (the Vth correction and the signal writing) for each drive unit in sequence.

The scanning-line drive circuit 24 selects all the unit write scanning lines WSL* included in one drive unit at the same time (or around the same time) at the time of Vth correction. Specifically, in the example of FIG. 6, the scanning-line drive circuit 24 selects the two unit write scanning lines WSL*(p) and WSL*(p+1) included in one drive unit at the same time (or around the same time) at the time of the Vth correction. That is to say, the scanning-line drive circuit 24 selects all of the pixels 11 included in the drive unit at the same time for Vth correction (e.g., all of the pixels 11 included in sub-pixel rows: n, n+1, n+2, and n+3).

Further, the scanning-line drive circuit 24 selects the unit write scanning lines WSL* included in one drive unit in sequence in the scanning direction at the time of signal writing, where the scanning direction (also referred to as a "drive unit scanning direction") is a direction in which the drive units are scanned for. Thus, for the signal writing operation the unit write scanning lines WSL* of a given drive unit are scanned separately in sequence, in contrast to the Vth correction operation, in which all of the unit write scanning lines WSL* of a given drive unit are scanned simultaneously. The drive unit scanning direction is, for example, a direction parallel to the direction from the upper end of the display panel 10 to the lower end. However, the drive unit scanning direction may alternatively be a direction parallel to the direction heading from the lower end of the display panel 10 to the upper end.

In the example of FIG. 6, for the signal writing operation the scanning-line drive circuit 24 selects the two unit write scanning lines WSL*(p) and WSL*(p+1) included in one drive unit in the order of the unit write scanning line WSL*(p) first and then the unit write scanning line WSL*(p+1) second. Accordingly, the scanning-line drive circuit 24 simultaneously selects a plurality of pixels 11 included in the n-th sub-pixel row, and a plurality of pixels 11 included in the (n+2)-th sub-pixel row through the unit write scanning line WSL*(p) at the time of signal writing, and then simultaneously selects a plurality of pixels 11 included in the n-th sub-pixel row and a plurality of pixels 11 included in the (n+3)-th sub-pixel row through the unit write scanning line WSL*(p+1).

The scanning-line drive circuit 24 is capable of outputting two kinds of voltages (Von and Voff), for example. Specifically, the scanning-line drive circuit 24 supplies the two kinds of voltages (Von and Voff), to drive target pixels 11 through the scanning line WSL so as to perform on/off control of the write transistor Tr2. Here, Von is not lower than an on-voltage of the write transistor Tr2. Von is a peak value of the write pulse outputted from the scanning-line drive circuit 24 in the "second half of the Vth correction preparation period" described later, the "Vth correction period", the "signal writing and μ correction period", and so on. Voff is a value that is lower than the on-voltage of the write transistor Tr2, and is lower than Von. Voff is a peak value of the write pulse outputted from the scanning-line drive circuit 24 in the "first half of the Vth correction preparation period" described later, the "light-emitting period", and so on.

The power-source line drive circuit 25 selects the unit power source lines DSL* for each predetermined unit in sequence, for example, in response to (in synchronism with) input of the control signal 21A. The power-source line drive circuit 25 is capable of outputting the two kinds of voltages (Vcc and Vss), for example. Specifically, the power-source line drive circuit 25 supplies the two kinds of voltages (Vcc and Vss) to the entire one drive unit (that is to say, all the pixels 11 included in the one drive unit) including the pixels 11 selected by the scanning-line drive circuit 24 through the unit power source line DSL*. Here, Vss is a voltage value that is lower than the sum voltage (Vel+Vcath) of the threshold voltage Vel of the organic EL element 13 and the cathode voltage Vcath of the organic EL element 13. Vcc is a voltage value that is not lower than the voltage (Vel+Vcath).

Operation

Next, a description will be given of operation (operation from non-light emission to light emission) of the display apparatus 1 according to the present embodiment. In the present embodiment, even if the I-V characteristic of the organic EL element 13 changes with time, or the threshold voltage or the mobility of the drive transistor Tr1 changes with time, in order not to be influenced by those changes, and to keep the luminance of the organic EL element 13 at a certain value, the correction operation against variations of the I-V characteristic of the organic EL element 13, and the correction operation against variations of the threshold voltage and the mobility of the drive transistor Tr1 are incorporated.

Figure 8:
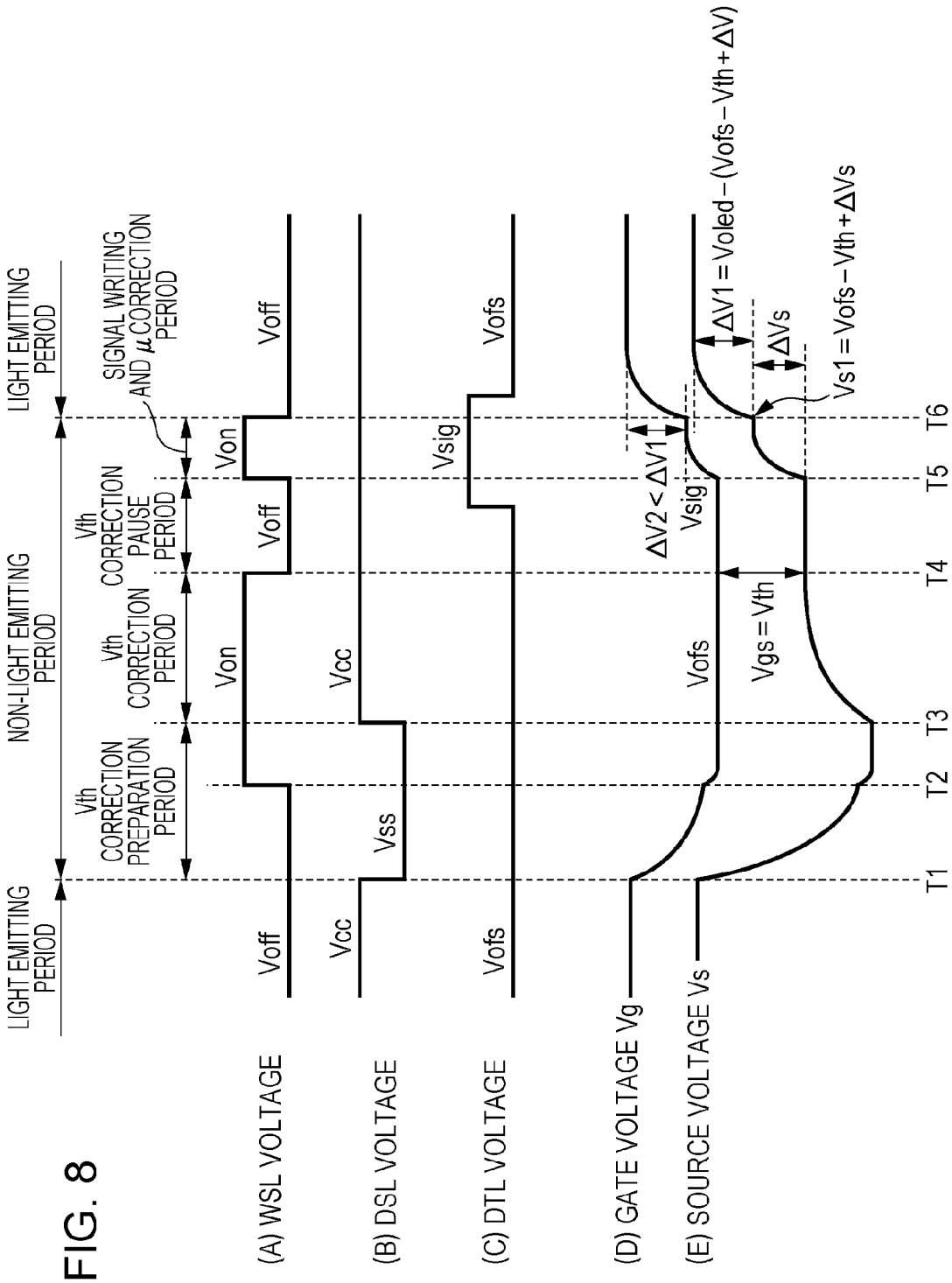
FIG. 8 is a waveform chart illustrating an example of changes with time in voltages applied to WSL, DSL, DTL, a gate voltage, and a source voltage when attention is given to one pixel (sub-pixel)

FIG. 8 illustrates an example of various waveforms in the display apparatus 1. FIG. 8 illustrates a state in which binary voltage changes occur every moment in the scanning line WSL, the power source line DSL, and the signal line DTL. Further, FIG. 8 illustrates a state in which the gate voltage Vg and the source voltage Vs of the drive transistor Tr1 change every moment in response to a voltage change in the scanning line WSL, the power source line DSL, and the signal line DTL.

Vth Correction Preparation Period

First, the drive circuit 20 makes preparations for Vth correction, which brings the gate-source voltage Vgs of the drive transistor Tr1 close to the threshold voltage of the drive transistor Tr1. Specifically, when the voltage of the scanning line WSL is Voff, the voltage of the signal line DTL is Vofs, and the voltage of the power source line DSL is Vcc (that is to say, when the organic EL element 13 is emitting light), the power-source line drive circuit 25 drops the voltage of the power source line DSL in response to the control signal 21A from Vcc to Vss (T1). Then, the source voltage Vs decrease to Vss, and the organic EL element 13 emits no light. At this time, the gate voltage Vg decreases by the coupling through the holding capacitor Cs.

Next, while the voltage of the power source line DSL is Vss, and the voltage of the signal line DTL is Vofs, the scanning-line drive circuit 24 raises the voltage of the scanning line WSL from Voff to Von in response to the control signal 21A (T2). Then, the gate voltage Vg decreases to Vofs. At this time, the potential difference Vgs between the gate voltage Vg and the source voltage Vs may be smaller, equal to, or larger than the threshold voltage of the drive transistor Tr2.

Vth Correction Period

Next, the drive circuit 20 performs Vth correction. Specifically, while the voltage of the signal line DTL is Vofs, and the voltage of the scanning line WSL is Von, the power-source line drive circuit 25 increases the voltage of the power source line DSL from Vss to Vcc (T3) in accordance with the control signal 21A. Then, a current Ids flows between the drain and the source drive transistor Tr1, and the source voltage Vs increases. At this time, if the source voltage Vs is lower than (Vofs−Vth) (if Vth correction has not yet been completed), the current Ids flows between the drain and the source of the drive transistor Tr1 until the drive transistor Tr1 cuts off (until the potential difference Vgs becomes Vth). Thereby, the gate voltage Vg becomes Vofs, and the source voltage Vs increases. As a result, the holding capacitor Cs is charged to Vth, and the potential difference Vgs becomes Vth.

After that, before the signal-line drive circuit 23 changes the voltage of the signal line DTL from Vofs to Vsig in response to the control signal 21A, the scanning-line drive circuit 24 drops the voltage of the scanning line WSL from Von to Voff in response to the control signal 21A (T4). Then, the gate of the drive transistor Tr1 becomes floating, and thus it is possible to keep the potential difference Vgs at Vth regardless of the voltage value of the signal line DTL. In this manner, by setting the potential difference Vgs to Vth, it is possible to prevent the luminance of the organic EL element 13 from varying even if the threshold voltage Vth of the drive transistor Tr1 varies for each pixel circuit 12.

Vth Correction Pause Period

After that, during a pause period of the Vth correction, the signal-line drive circuit 23 changes the voltage of the signal line DTL from Vofs to Vsig.

Signal Writing and μ Correction Period

After the Vth correction pause period is completed (that is to say, the Vth correction has been completed), the drive circuit 20 performs writing the signal voltage and the μ correction in accordance with the image signal 20A. Specifically, while the voltage of the signal line DTL is Vsig, and the voltage of the power source line DSL is Vcc, the scanning-line drive circuit 24 increases the voltage of the scanning line WSL from Voff to Von in response to the control signal 21A (T5), and connects the gate of the drive transistor Tr1 to the signal line DTL. Then, the gate voltage Vg of the drive transistor Tr1 becomes the voltage Vsig of the signal line DTL. At this time, the anode voltage of the organic EL element 13 is lower than the threshold voltage Vel of the organic EL element 13 at this stage yet, and the organic EL element 13 cuts off. Accordingly, the current Ids flows through the element capacitor Coled of the organic EL element 13, and thus the element capacitor Coled is charged. Thus, the source voltage Vs increases by ΔVs, and the potential difference Vgs becomes (Vsig+Vth−ΔVs) after a while. In this manner, the writing and μ correction are performed at the same time. Here, the greater the mobility μ of the drive transistor Tr1, the larger ΔVs becomes, and thus it is possible to remove variations of the mobility μ for each pixel 11 by decreasing the potential difference Vgs by ΔV before emitting light.

Light Emission

Lastly, the scanning-line drive circuit 24 decreases the voltage of the scanning line WSL from Von to Voff in response to control signal 21A (T6). Then, the gate of the drive transistor Tr1 becomes floating, the current Ids flows between the drain and the source through the drive transistor Tr1, and the source voltage Vs increases. As a result, a voltage higher than the threshold voltage Vel is applied to the organic EL element 13, and the organic EL element 13 emits light with desired luminance.

Next, a description will be given of an example of scanning of Vth correction and signal writing and μ correction by the display apparatus 1 according to the present embodiment with reference to FIG. 8 and FIG. 9. In this regard, FIG. 9 illustrates an example of scanning of Vth correction, and signal writing and μ correction in two adjacent drive units, i.e., four consecutive display pixel unit rows, i.e., the eight sub-pixel rows connected to the unit write scanning lines WSL*(p), WSL*(p+1), WSL*(p+2), and WSL* (p+3).

In this regard, in the following, a description will be given on the assumption that all the pixels 11 in one drive unit are grouped into groups each connected to a unit write scanning line WSL*. In the present embodiment, all the pixels 11R and all the pixels 11W in one drive unit are put into one group, and all the pixels 11G and all the pixels 11B in one drive unit are put into another group. Thus, in the following, it is assumed that all the pixels 11R and all the pixels 11W in a first drive unit, which are connected to the write scanning line WSL*(p), are put into a first group, and all the pixels pixel 11G and all the pixels 11B in the first drive unit, which are connected to the write scanning line WSL*(p+1), are put into a second group. Further, all the pixels 11R and all the pixels 11W in a second drive unit, which are connected to the unit write scanning line WSL*(p+2), are put into a third group, and all the pixels 11G and all the pixels 11B in the second drive unit, which are connected to the unit write scanning line WSL(n+3), are put into a fourth group.

The drive circuit 20 performs Vth correction on all the groups in the first drive unit (the first and the second groups) in the same period, and then performs signal voltage writing (and μ correction) on all the groups in the first drive unit (the first and the second groups) for each group in sequence. After that, the drive circuit 20 performs Vth correction on all the groups in the second drive unit (the third and the fourth groups) in the same period, and then performs signal voltage writing (and μ correction) on all the groups in the second unit unit (the third and the fourth groups) for each group in sequence. At this time, the drive circuit 20 performs Vth correction on one drive unit in one horizontal period (1H), and then performs signal voltage writing (and μ correction) in one horizontal period (1H). That is to say, the drive circuit 20 performs Vth correction and signal voltage writing (and μ correction) on one drive unit continuously using two horizontal periods (2H).

Further, when the drive circuit 20 performs signal writing for each group, the drive circuit 20 performs signal writing on all the pixels 11 included in the group at the same time. Specifically, when the unit write scanning line WSL*(p) is selected, the drive circuit 20 outputs the above-described voltage V(p) to each signal line DTL. That is to say, when the unit write scanning line WSL*(p) is selected, the drive circuit 20 outputs Vsig(n, m) and Vsig(n, m+2) to the even-numbered signal lines DTL (DTL(m) and DTL(m+2)), and at the same time, outputs Vsig(n+2, m+1) and Vsig(n+2, m+3) to the odd-numbered signal lines (DTL(m+1) and DTL(m+3)). Further, when the unit write scanning line WSL*(p+1) is selected, the drive circuit 20 outputs Vsig(n+1, m) and Vsig (n+1, m+2) to the even-numbered signal line DTL (DTL(m) and DTL(m+2)), and at the same time, outputs Vsig(n+3, m+1), Vsig(n+3, m+3) to the odd-numbered signal lines (DTL(m+1) and DTL(m+3)).

As a result, in the individual pixels 11R having the same luminescent color, periods (so-called waiting time Δt1) from the end of the Vth correction to the beginning of the signal voltage writing (and μ correction) match, and thus the waiting time Δt1 in a plurality of pixels 11R matches for each pixel row. In the present embodiment, waiting time Δt2 of each pixel 11W is equal to the waiting time Δt1 for each pixel 11R. Accordingly, the waiting time Δt2 matches in the individual pixels 11W having the same luminescent color, and the waiting time Δt2 in a plurality of pixels 11W matches for each pixel row. Further, in the individual pixels 11G having the same luminescent color, the waiting time Δt3 matches, and the waiting time Δt3 in a plurality of pixels 11G matches for each pixel row. In the present embodiment, the waiting time Δt4 for each pixel 11B is equal to the waiting time Δt3 for each pixel 11G. Accordingly, in the individual pixels 11B having the same luminescent color, the waiting time Δt4 matches, and thus the waiting time Δt4 in a plurality of pixels 11B matches for each pixel row. In this regard, the waiting time Δt1 and Δt2 for the pixels 11R and 11B, and the waiting time Δt3 and Δt4 for the pixels 11G and 11B are different with each other. This has a slight influence on color reproductivity, but no influence on color irregularity.

Advantages

Next, a description will be given of advantages of the display apparatus 1 according to the present embodiment.

Figure 10:
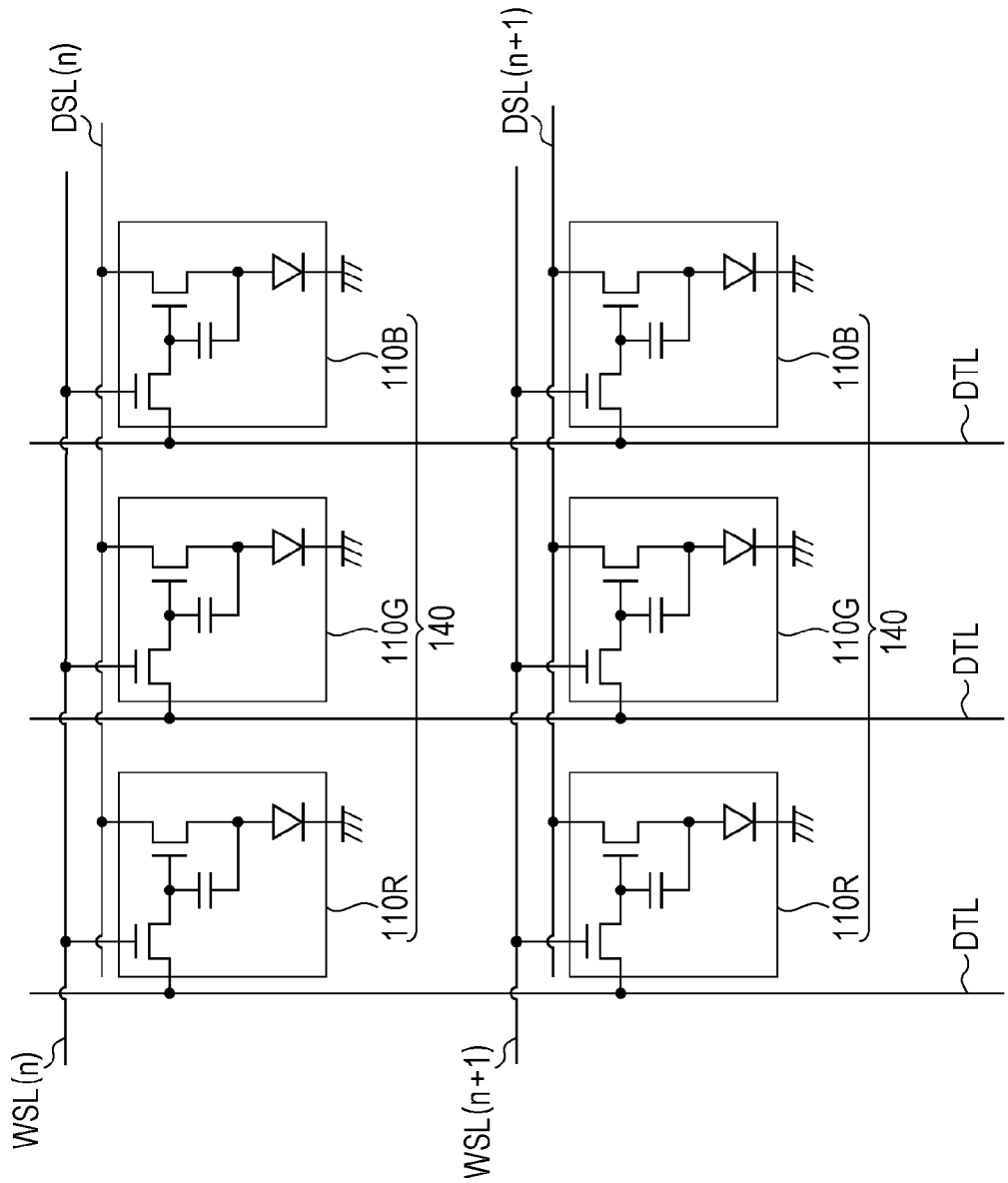
FIG. 10 is a diagram illustrating an example of a circuit configuration of each pixel in a display panel according to a comparative example.
Figure 11:
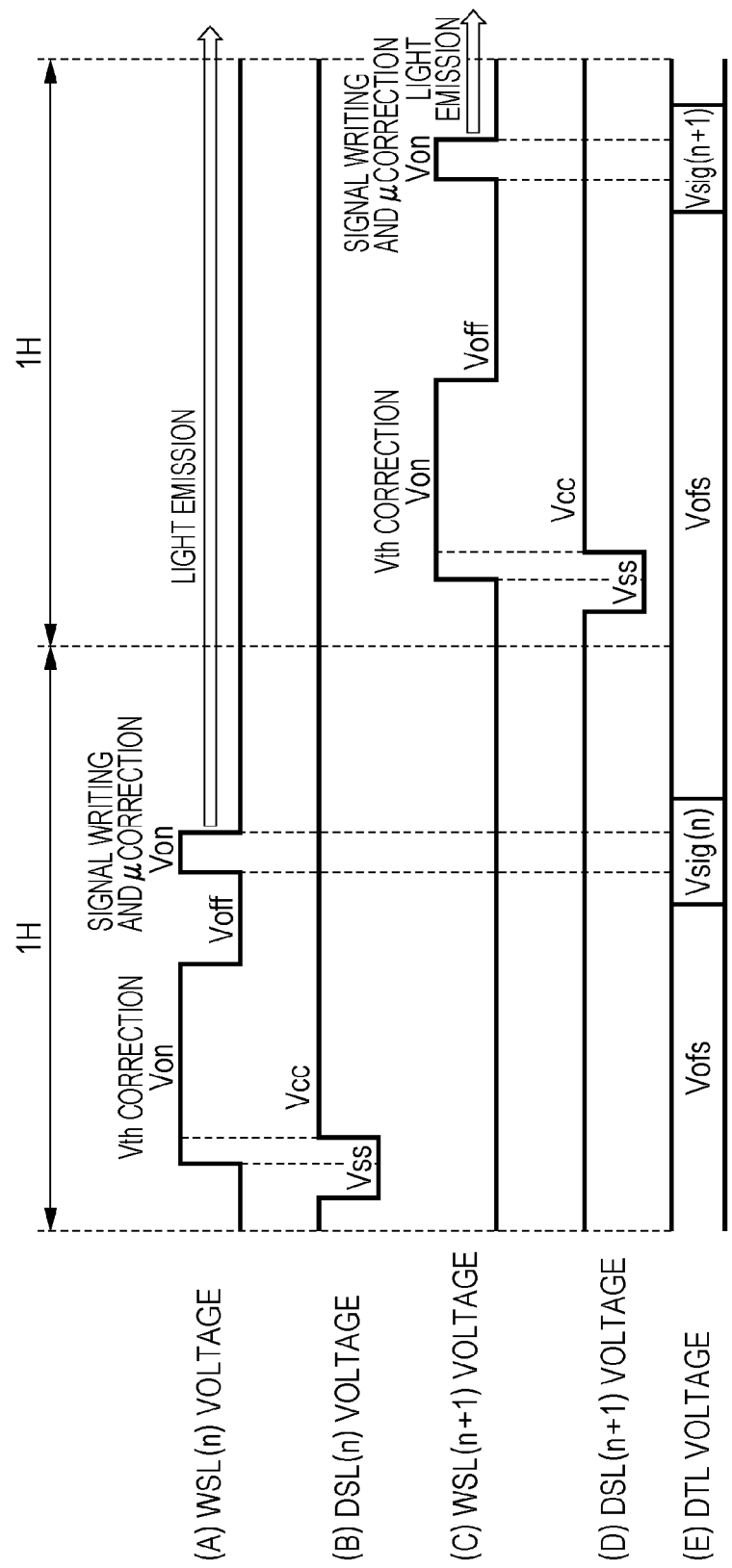
FIG. 11 is a waveform chart illustrating an example of changes with time in voltages applied to WSL, DSL, and DTL when attention is given to two pixels adjacent to each other in a column direction in a display apparatus having the layout in FIG. 10.
Figure 12:
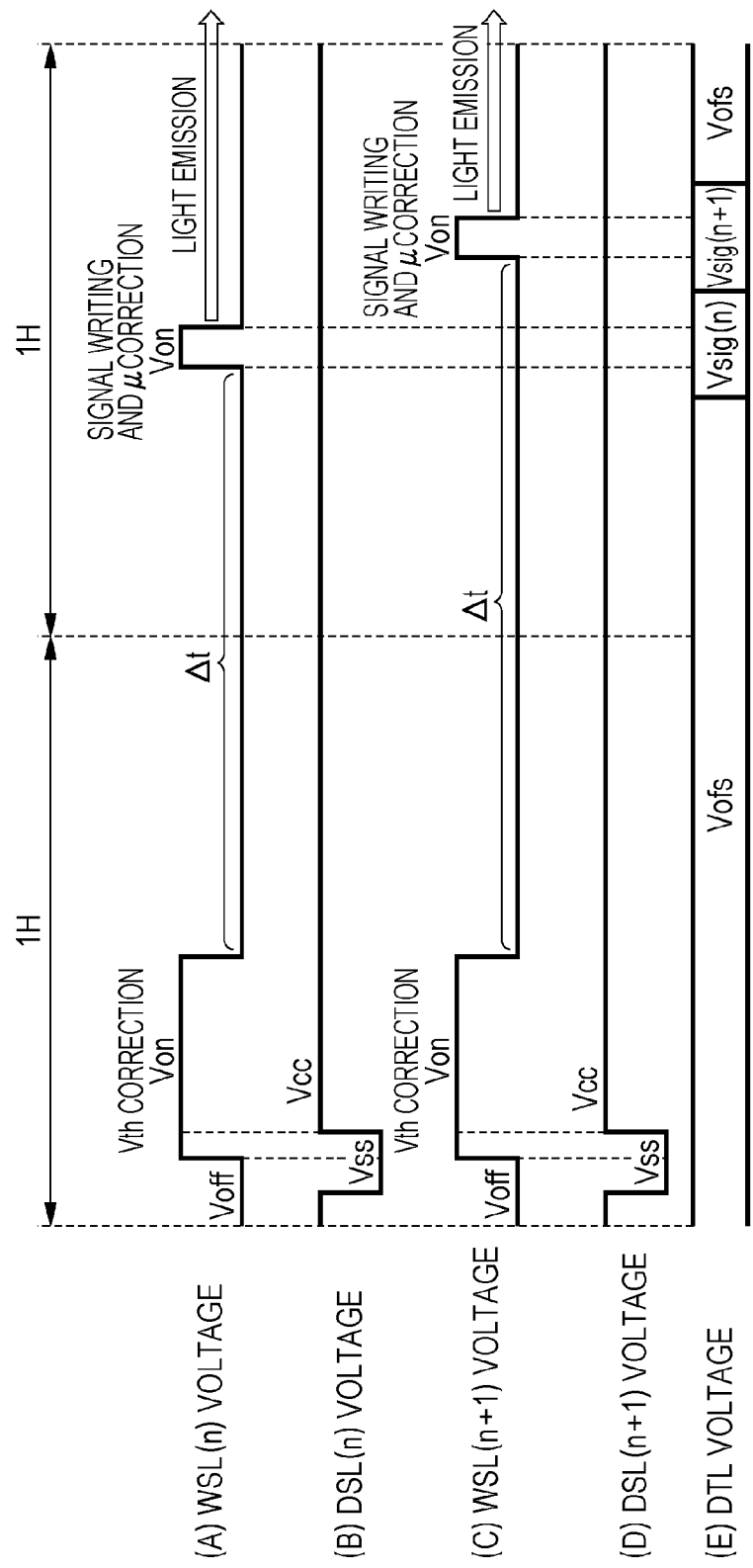
FIG. 12 is a waveform chart illustrating another example of changes with time in voltages applied to WSL, DSL, and DTL when attention is given to two pixels adjacent to each other in a column direction in a display apparatus having the layout in FIG. 10.

FIG. 10 illustrates an example of a pixel arrangement generally used in related art. In related art, the individual pixels 110R, 110G, and 110B included in the display pixel 140 are connected to a common scanning line WSL(n) and a power source line DSL(n). In such a pixel arrangement, for example, as illustrated in FIG. 11, when Vth correction and signal writing are performed for each 1H period, it has been difficult to shorten 1H period, and thereby to shorten a scanning period for 1F (that is to say, to drive at a higher speed). Accordingly, for example, as illustrated in FIG. 12, Vth correction is performed on two lines together in a common 1H period, and then signal writing is performed for each line in the next 1H period. In this drive method, Vth correction is bundled, and thus is suitable for driving at a high speed. However, a waiting period Δt from an end of Vth correction to a start of signal writing is different for each line. Accordingly, even if signal voltages having the same grayscale is applied to the gates of the drive transistors of individual lines, luminance become different for each line, and thus there has been a problem in that luminance unevenness occurs.

On the other hand, in the present embodiment, each unit write scanning line WSL* used for selecting each pixel 11 is connected to a plurality of pixels 11 having the same luminescent color in one drive unit. Further, each unit power source line DSL* to be used for supplying a drive current to each pixel 11 is connected to all the pixels 11 in one drive unit. Thereby, as described above, it is possible to perform Vth correction on all the groups in one drive unit around the same time, and then to perform signal voltage writing on all the groups in one drive unit for each group. As a result, in each pixel 11 having the same luminescent color, a waiting time from an end of Vth correction to a start of μ correction match, and thus a waiting time of the pixels 11 having the same luminescent color matches for each line. Accordingly, it is possible to reduce the occurrence of luminance unevenness caused by bundling Vth correction.

Figure 13:
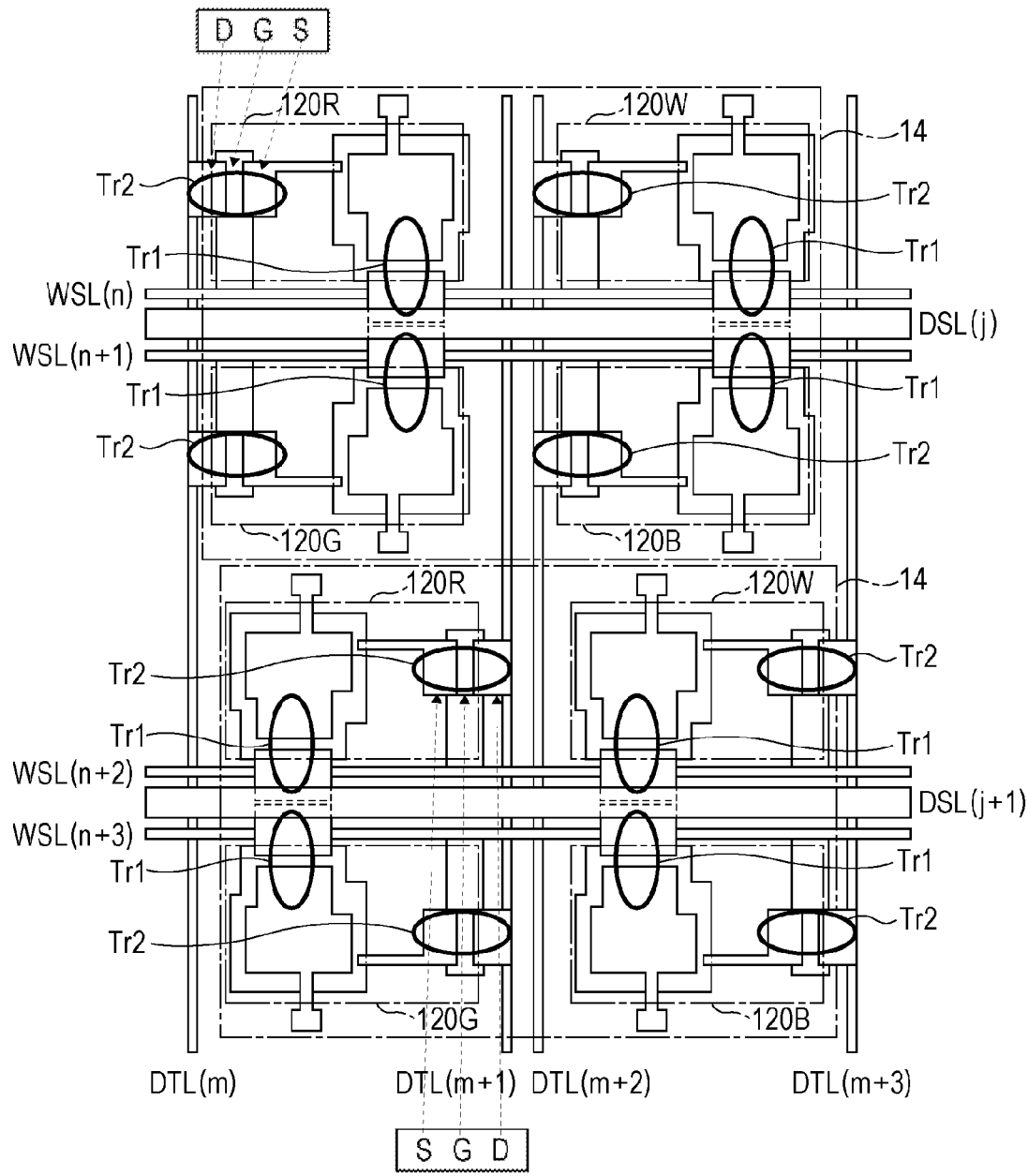
FIG. 13 is a diagram illustrating an example of a layout of each pixel circuit in a display panel according to the comparative example.

FIG. 13 illustrates an example of a pixel arrangement according to a comparative example. In this comparative example, in two display pixel units 14 that are in different rows with each other in one drive unit and are adjacent with each other, the layouts (in particular, the arrangement of the gate (G), the source (S) and the drain (D)) of the write transistors Tr2 having the same luminescent color in the pixel 11 are different with each other. For example, as illustrated in FIG. 13, the disposition direction of the gate, the source, the drain of the write transistor Tr2 of the pixels 11R, are different with each other in the pixel 11R of the n-th sub-pixel row and the pixel 11R of the (n+2)-th pixel row. Accordingly, in the manufacturing process, the influences of misalignment of relative positions of the source and the drain with respect to the gate caused by mask misalignment at the time of forming the source and the drain are different with each other in the pixel 11R of the n-th pixel row and the pixel 11R of the (n+2)-th pixel row.

Figure 14:
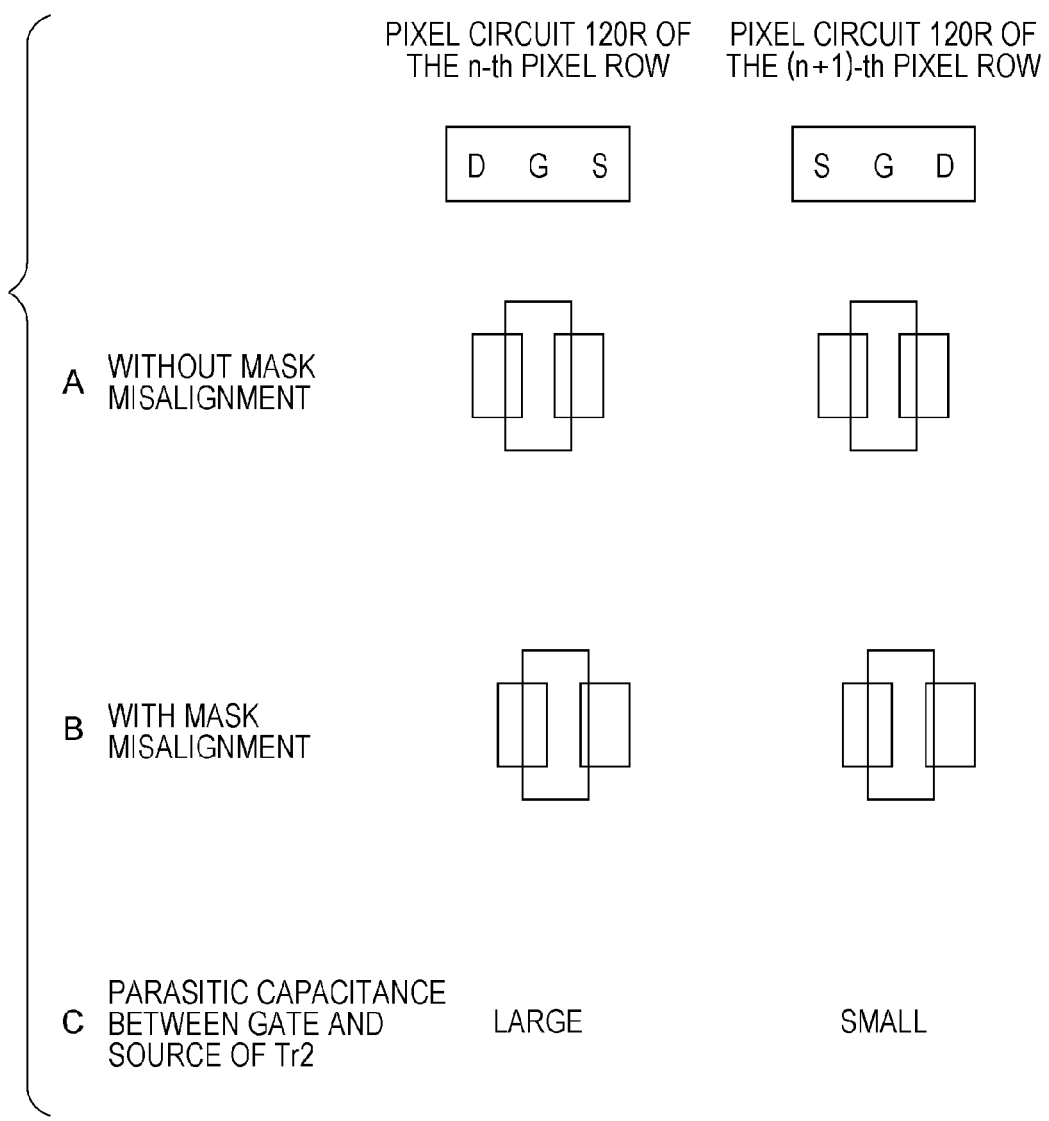
FIG. 14 is a conceptual diagram for describing mask misalignment.

For example, as illustrated in FIG. 14B, if a mask is slightly shifted to the right side in FIG. 14B, in the write transistor Tr2 in the pixel circuit 120R of the n-th pixel row, the area of the drain located right over the gate becomes larger than the area of the source located right over the gate, and the parasitic capacitance between the gate and the source of the write transistor Tr2 becomes large. On the other hand, in the write transistor Tr2 of the pixel circuit 120R of the (n+2)-th pixel row, the area of the drain located right over the gate becomes smaller than the area of the source located right over the gate, and thus the parasitic capacitance between the gate and the source of the write transistor Tr2 becomes small.

Figure 15:
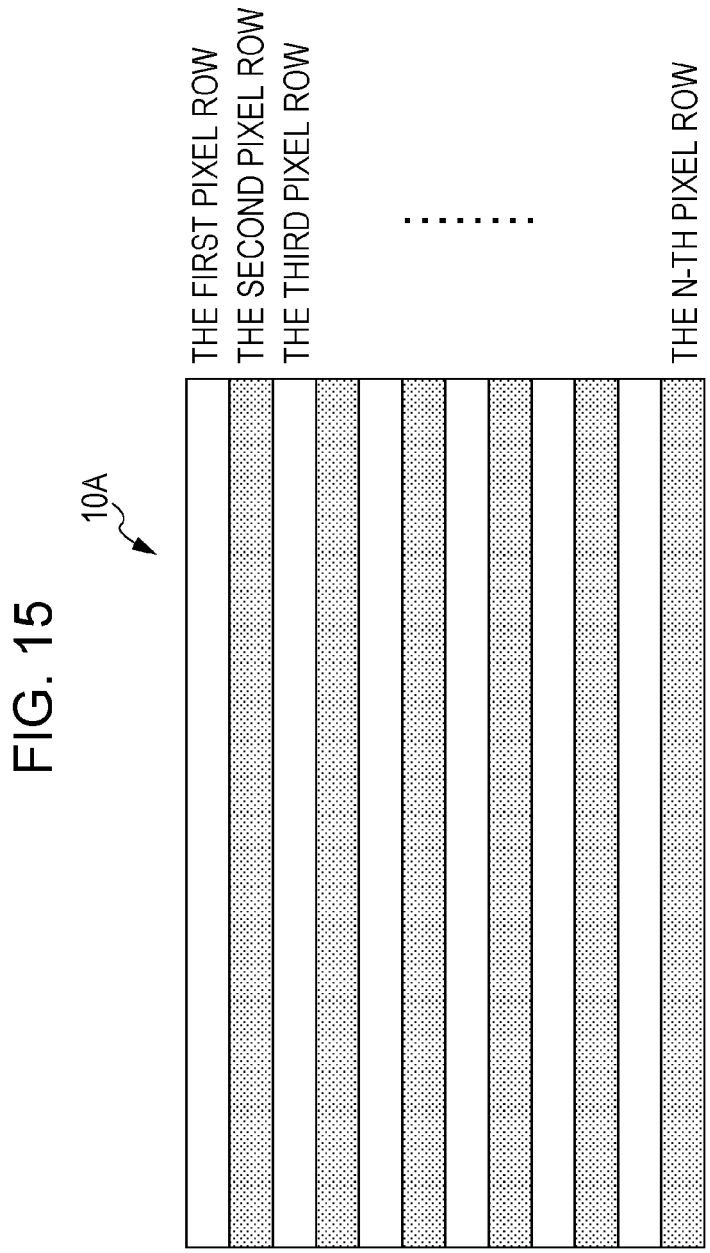
FIG. 15 is a diagram illustrating an example of luminance unevenness caused by mask misalignment.

Here, the parasitic capacitance between the gate and the source of the write transistor Tr2 greatly influences the size of minus coupling that arises on the gate electrode 15A of the drive transistor Tr1 at rising time of the signal writing (time T6). Specifically, if the parasitic capacitance between the gate and the source of the write transistor Tr2 is large, the minus coupling that occurs on the gate electrode 15A of the drive transistor Tr1 becomes large, and the gate-source voltage Vgs of the drive transistor Tr1 becomes small. On the other hand, if the parasitic capacitance between the gate and the source of the write transistor Tr2 is small, the minus coupling that occurs on the gate electrode 15A of the drive transistor Tr1 becomes small, and the gate-source voltage Vgs of the drive transistor Tr1 becomes large. In this manner, when the parasitic capacitance between the gate and the source of the write transistor Tr2 varies, the gate-source voltage Vgs of the drive transistor Tr1 varies. As a result, the luminance of the pixel 11R of the n-th pixel row becomes small, and the luminance of the pixel 11R of the (n+2)-th pixel row becomes large, and thus striped luminance unevenness as illustrated in FIG. 15 occurs.

On the other hand, in the present embodiment, in the two display pixel units 14 that are in different rows with each other in one drive unit and are adjacent with each other, the layouts (in particular, the arrangement of the gate (G), the source (S) and the drain (D)) of the write transistors Tr2 having the same luminescent color in the pixel 11 are equal to each other. Accordingly, for example, in the manufacturing process, the influences of misalignment of relative positions of the source and the drain with respect to the gate caused by mask misalignment at the time of forming the source and the drain are equal to each other in the pixel 11R of the n-th pixel row and the pixel 11R of the (n+2)-th pixel row. As a result, for example, the luminance of the pixel 11R of the n-th pixel row and the luminance of the pixel 11R of the (n+2)-th pixel row become the same with each other, and thus the striped luminance unevenness as illustrated in FIG. 15 does not occur.

2. Variations

In the following, a description will be given of various variations of the display apparatus 1 according to the embodiment. In this regard, hereinafter a same reference symbol is given to a component common to the display apparatus 1 according to the embodiment. Further, a description will be suitably omitted of the component common to the display apparatus 1 according to the embodiment.

Variation 1

In the above-described embodiment, two unit write scanning lines WSL* are assigned for each one drive unit. However, although not illustrated in the figure, the same number unit write scanning lines WSL* may be assigned for each one drive unit as the number of display pixel unit rows included in the one drive unit Variation 2

In the above-described embodiment, the unit power source lines DSL* assigned for each one drive unit have a branched structure. However, although not illustrated in the figure, the same number of separate power source lines DSL may be assigned for each one unit as the number of display pixel unit rows included in one drive unit. However, in that case, the same voltage is applied to the power source lines DSL for each unit.

Variation 3

In the above-described embodiment, the example has been illustrated of the case where both in the drive transistor Tr1 and in the write transistor Tr2, the arrangement of the gate, the source, and the drain extends in a direction parallel to the extending direction of the signal line DTL. However, although not illustrated in the figure, both in the drive transistor Tr1 and in the write transistor Tr2, the arrangement of the gate, the source, and the drain may extend other directions, such as in a direction parallel to the extending direction of the scanning line WSL or the power source line DTL. In the case of such a configuration, the striped luminance unevenness as illustrated in FIG. 15 does not occur.

Variation 4

Figure 16:
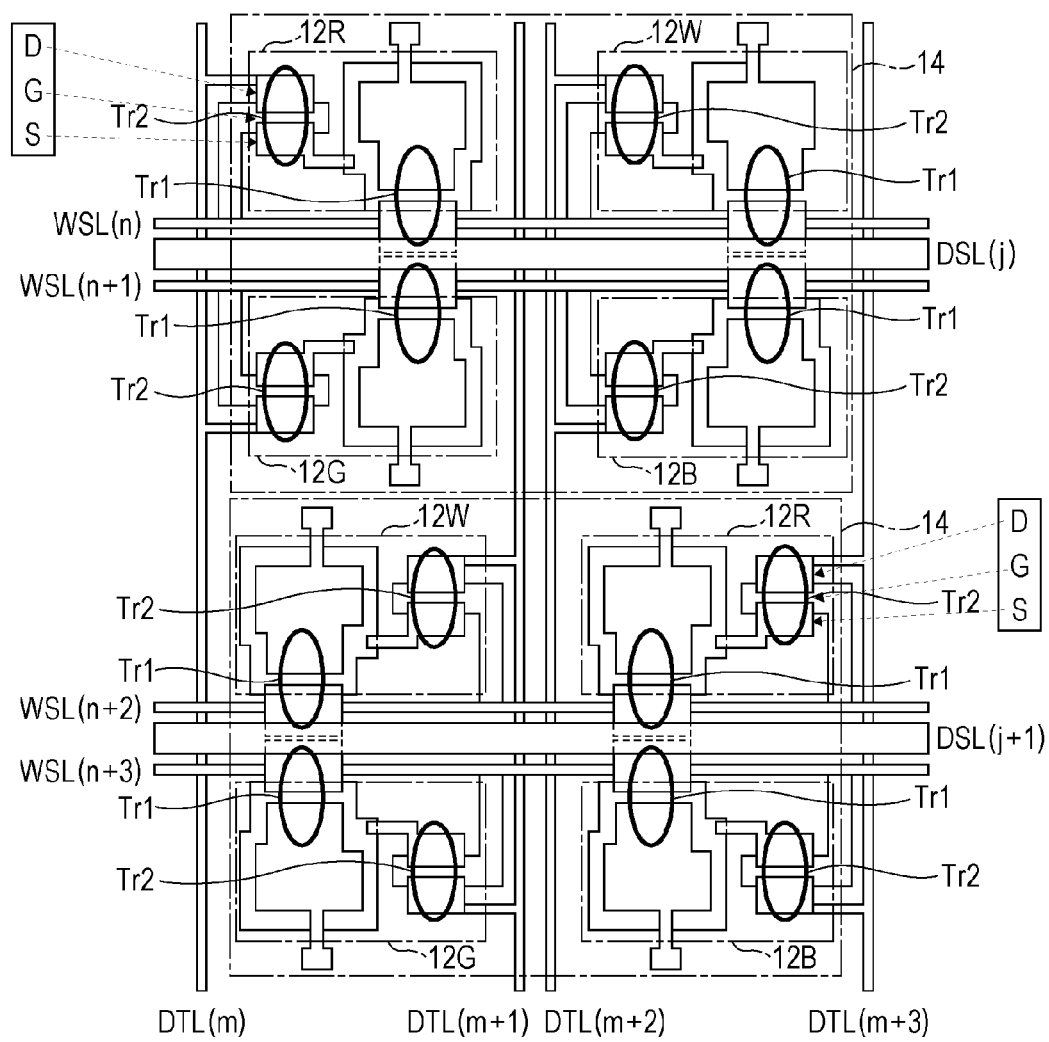
FIG. 16 is a diagram illustrating another example of the layout in FIG. 6.

In the above-described embodiment, in two display pixel units 14 that are in different rows with each other in one unit and are adjacent with each other, two pixels 11 having the same luminescent color with each other have been disposed between the two common signal lines DTL. However, in the two display pixel units 14 that are in different rows with each other in one unit and are adjacent with each other, one of the two pixels 11 having the same luminescent color with each other may be disposed between the two signal lines DTL(m) and DTL(m+1), and the other of the two pixels 11 may be disposed between the two signal lines DTL(m+2) and DTL(m+3). For example, as illustrated in FIG. 16, in the two display pixel units 14 that are in different rows with each other in one unit and are adjacent with each other, one of the two pixels 11R may be disposed between the two signal lines DTL(m) and DTL(m+1), and the other of the pixels 11R may be disposed between the two signal lines DTL(m+2) and DTL(m+3).

Variation 5

While an embodiment having a red, green, blue, and white pixel circuit for each pixel display unit has been described, the disclosure is by no means limited to this illustrative configuration. For example, embodiments including less than four pixel circuits per pixel display unit and embodiments including more than four pixel circuits per pixel display unit may be within the scope of one or more of the appended claims. Furthermore, while the pixel circuits illustrated in the figures appear to have a uniform size, the disclosure is by no means limited to this illustrative configuration. For example, a display element of some pixel circuits may be differently sized than or may have a different shape than a display element of other pixel circuits.

3. Applications

In the following, descriptions will be given of applications of the display apparatus 1 described in the above-described embodiment and the variations thereof (hereinafter, referred to as "the embodiment, and so on"). It is possible to apply the display apparatus 1 according to the embodiment to a display apparatus of electronic systems in every field, in which an image signal that is externally input or an image signal internally generated is displayed as an image or a video image. For example, the electronic systems include a television apparatus, a digital camera, a notebook-sized personal computer, a mobile terminal apparatus, such as a mobile phone, and so on, or a video camera, and so on.

Application 1

Figure 17:
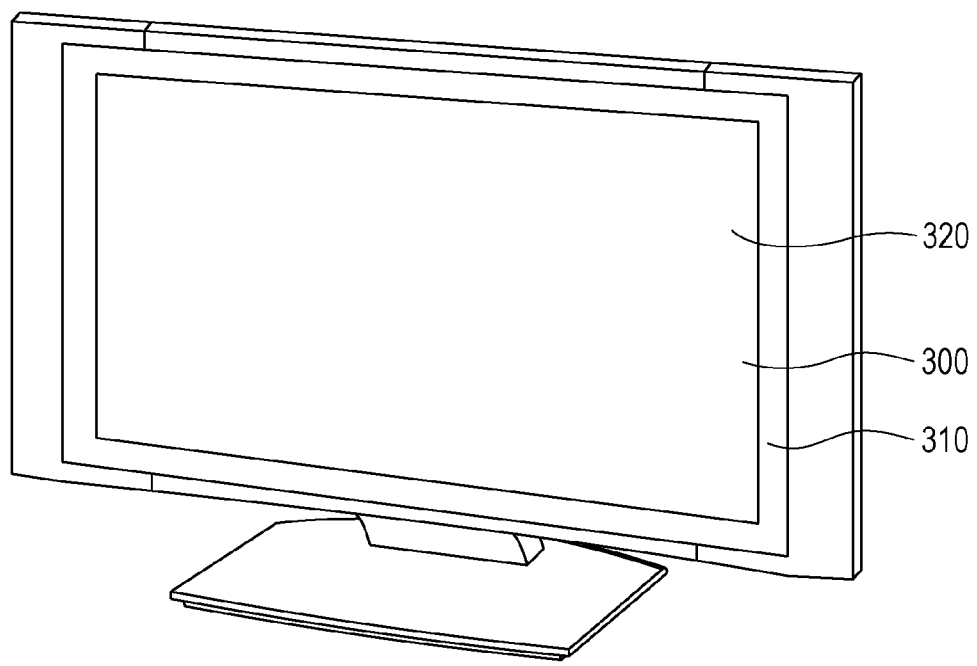
FIG. 17 is a perspective view illustrating an outer view of an application 1 to which a light emitting apparatus according to the embodiment is applied.

FIG. 17 illustrates an outer view of a television apparatus to which the display apparatus 1 according to the embodiment, and so on is applied. This television apparatus includes, for example, an image-display screen section 300 including a front panel 310, and a filter glass 320. And the image-display screen section 300 includes the display apparatus 1 according to the embodiment.

Application 2

Figure 18A:
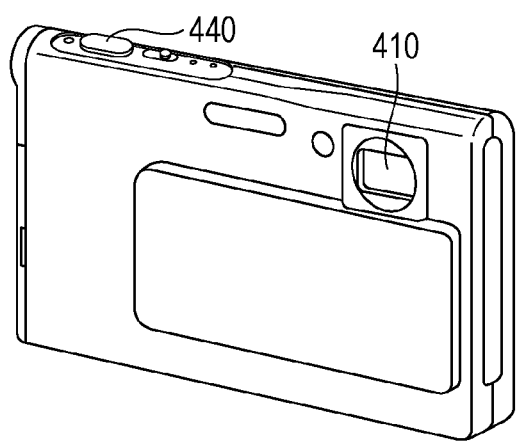
FIG. 18A is a perspective view illustrating an outer view of an application 2, taken from a front side of the application 2.
Figure 18B:
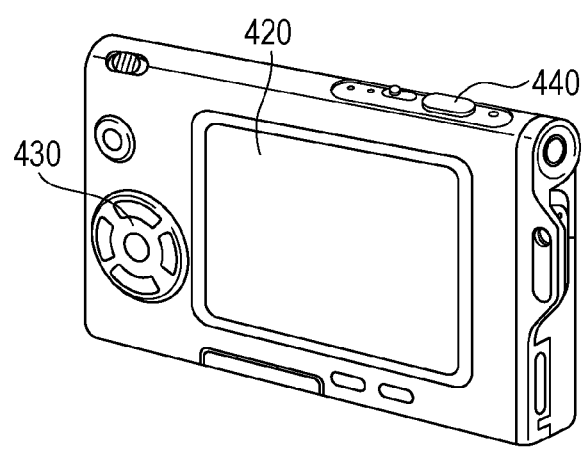
FIG. 18B is a perspective view illustrating an outer view of the application 2, taken from a back side of the application 2.

FIGS. 18A and 18B illustrate an outer view of a digital camera to which the display apparatus 1 according to the embodiment is applied. This digital camera includes, for example, a flash-light emitting section 410, a display section 420, a menu switch 430, and a shutter button 440. The display section 420 includes the display apparatus 1 according to the embodiment, and so on.

Application 3

Figure 19:
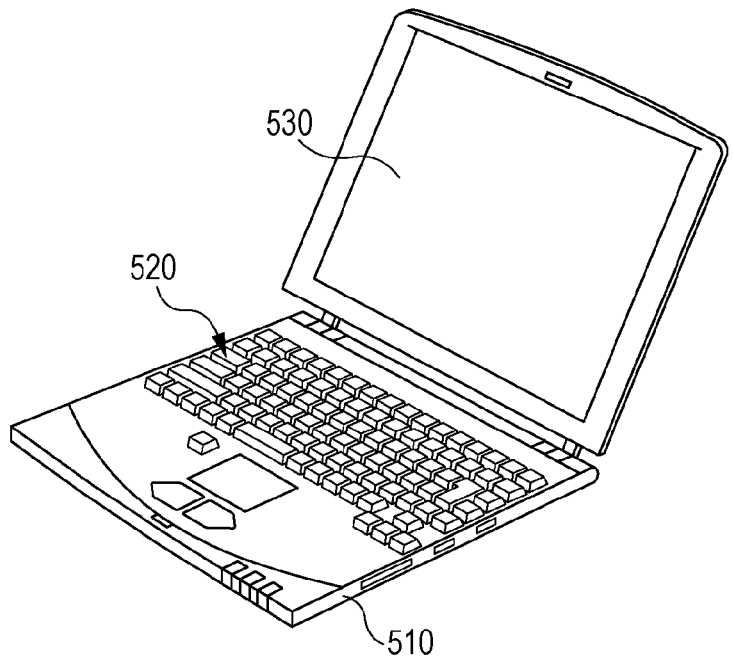
FIG. 19 is a perspective view illustrating an outer view of an application 3.

FIG. 19 illustrates an outer view of a notebook-sized personal computer to which the display apparatus 1 according to the embodiment is applied. This notebook-sized personal computer includes, for example, a main body 510, a keyboard 520 for input operation of characters, and so on, and a display section 530 on which an image is displayed. The display section 530 includes the display apparatus 1 according to the embodiment, and so on.

Application 4

Figure 20:
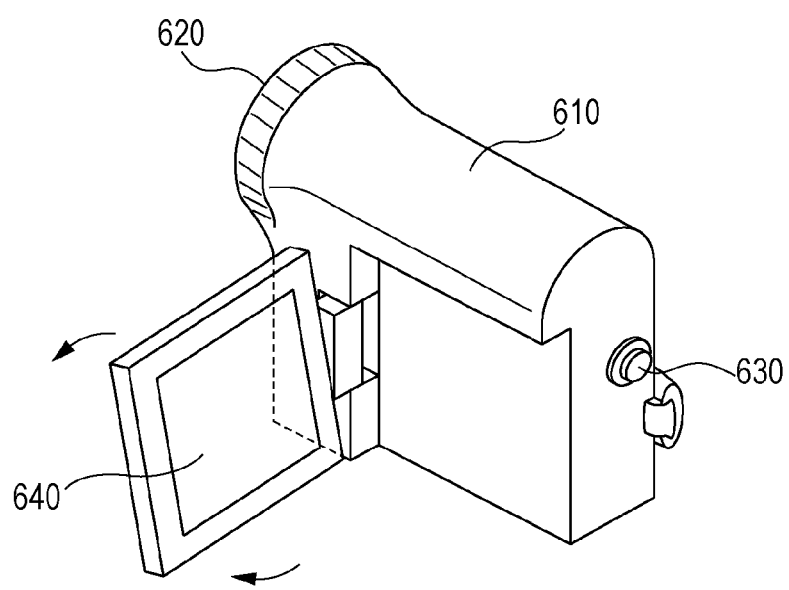
FIG. 20 is a perspective view illustrating an outer view of an application 4.

FIG. 20 illustrates an outer view of a video camera to which the display apparatus 1 according to the embodiment, and so on is applied. This video camera includes, for example, a main-body part 610, a subject-shooting lens 620 disposed at a front side face of the main-body part 610, a shooting start/stop switch 630, and a display section 640. The display section 640 includes the display apparatus 1 according to the embodiment, and so on.

Application 5

FIGS. 21A to 21G illustrate an outer view of a mobile phone to which the display apparatus 1 according to the embodiment, and so on is applied. This mobile phone has a configuration in which an upper case 710 and a lower case 720 are connected by a connection section (hinge section) 730, for example. The mobile phone includes a display 740, a sub-display 750, a picture light 760, and a camera 770. The display 740 or the sub-display 750 includes the display apparatus 1 according to the embodiment, and so on.

In the above, a description has been given of the present technique by giving the embodiment and the applications. However, the present technique is not limited to the above-described embodiment, and so on, and various variations are possible.

For example, a configuration of the pixel circuit 12 for active matrix addressing is not limited to the configuration described in each embodiment, and so on, and a capacitative element or a transistor may be added as necessary. In that case, a necessary drive circuit may be added in addition to the above-described signal-line drive circuit 23, the scanning-line drive circuit 24, the power-source line drive circuit 25, and so on in accordance with the variations of the pixel circuit 12.

Also, in the above embodiment, and so on, the driving of the signal-line drive circuit 23, the scanning-line drive circuit 24, and the power-source line drive circuit 25 are controlled by the timing generation circuit 21 and the image-signal processing circuit 22. However, the other circuits may control these circuits. Also, the signal-line drive circuit 23, the scanning-line drive circuit 24, and the power-source line drive circuit 25 may be controlled by hardware (a circuit) or by software (a program).

Also, in the above embodiment, and so on, a description has been given that the source and the drain of the write transistor Tr2, and the source and the drain of the drive transistor Tr1 are fixed. The opposed relationship between the source and the drain may be reversed in accordance with a direction of the current flow as a matter of course. At that time, in the above embodiment, and so on, the source may be replaced by the drain, and the drain may be replaced by the source.

Also, in the above embodiment, and so on, a description has been given on the assumption that the write transistor Tr2 and the drive transistor Tr1 are formed by n-channel MOS-type TFTs. However, at least one of the write transistor Tr2 and the drive transistor Tr1 may be formed by a p-channel MOS-type TFT. In this regard, if the drive transistor Tr1 is formed by a p-channel MOS-type TFT, in the above embodiment, and so on, the anode of the organic EL element 13 is replaced by the cathode, and the cathode of the organic EL element 13 is replaced by the anode. Also, in the above embodiment, and so on, the write transistor Tr2 and the drive transistor Tr1 are not necessarily amorphous TFT, or micro silicon TFT all the time, and may be a low-temperature poly-silicon TFT or an oxide semiconductor TFT, for example.

Also, for example, it is possible to configure the present technique as follows.

(1)
A display unit comprising:
a plurality of write scanning lines;
a plurality of signal lines; and
a plurality of pixel circuits disposed in a matrix form comprising rows and columns of pixel circuits, each of the plurality of pixel circuits including:
a display element,
a first transistor configured to sample a potential carried on one of the plurality of signal lines when a scanning pulse is applied to one of the plurality of write scanning lines, which is connected to the first transistor,
a capacitor with a first terminal configured to hold the potential sampled by the first transistor, and
a second transistor configured to supply a drive current to the display element, the magnitude of the drive current corresponding to a voltage between the first terminal of the capacitor and a second terminal of the capacitor,
wherein each of the plurality of pixel circuits corresponds to one of N display colors and the plurality of pixel circuits are grouped into display pixel units each comprising N of the plurality of pixel circuits corresponding respectively to the N display colors, which are contiguously disposed in R contiguous rows, $2 \leq R \leq N$, and
the first transistor of a given one of the plurality of pixel circuits included in a first one of the display pixel units is disposed in a same layout orientation as the first transistor of the one of the plurality of pixel circuits included in a second one of the display pixel units adjacent to the first one of the display pixel units in a column direction that corresponds to a same color as the given one of the plurality of pixel circuits.

(2)
The display unit of (1),
wherein, for each of the plurality of pixel circuits included in the first one of the display pixel units and the second one of the display pixel units adjacent to the first one of the display pixel units in a column direction, the first transistors of those pixel circuits corresponding to a same color as each other are disposed in a same layout orientation as each other.

(3)
The display unit of (1), further comprising:
a plurality of power supply lines, each connected to two respectively corresponding adjacent rows of the plurality of pixel circuits,
wherein the plurality of write scanning lines are each connected to ones of the plurality of pixel circuits that are disposed in a corresponding row of pixel circuits,
the plurality of signal lines are each connected to ones of the plurality of pixel circuits that are disposed in a corresponding column of pixel circuits,
the plurality of pixel circuits are grouped into drive units each comprising $K \geq 4$ contiguous rows of pixel circuits that are connected to a corresponding unit power supply line, which is made up of K/2 of the plurality of power supply lines configured as a common line,
each of the drive units includes $L \geq 2$ unit write scanning lines that each comprise $R \geq 2$ of the plurality of write scanning lines configured as a common line, where $K = L \cdot R$, and
each unit write scanning line corresponds to at least one of the display colors and is connected to all of the pixel circuits that correspond to any of the display colors to which the respective unit write scanning line corre- (4)
The display unit of (3),
wherein, for each of the plurality of pixel circuits included in the given one of the drive units, the first transistors of those pixel circuits connected to a same unit write scanning line as each other are disposed in a same layout orientation as each other.

(5)
The display unit of (4),
wherein, for each of the plurality of pixel circuits included in the given one of the drive units, the second transistors of those pixel circuits connected to a same unit write scanning line as each other are disposed in a same layout orientation as each other.

(6)
The display unit of (5),
further comprising a drive control section configured to cause the plurality of pixel circuits to display image frames corresponding to input image data by control driving of the plurality of write scanning lines, the plurality of signal lines, and the plurality of power supply lines,
wherein the plurality of pixel circuits are configured to perform, under control of the drive control section, a threshold correction operation that results in storing a threshold voltage of the second transistor of the respective one of the plurality of pixel circuit in the capacitor of the respective one of the plurality of pixel circuit, and
the drive control section is configured to cause each of the plurality of pixel circuits included in the given one of the drive units to perform the threshold correction operation simultaneously during a given image frame period.

(7)
The display unit of (6),
wherein the drive control section is configured to cause each of the plurality of pixel circuits included in the given one of the drive units to perform the threshold correction operation by causing the first transistor of the respective pixel circuit to be in a conductive state while a reference potential is carried on the signal line connected to the respective pixel circuit and while a drive voltage is applied to the second transistor of the respective pixel circuit.

(8)
The display unit of (6),
wherein the drive control section is configured to cause the plurality of pixel circuits to perform a signal writing operation of sampling a video signal potential by placing the first transistor of the respective pixel circuit in a conductive state while a video signal potential is applied to the signal line connected to the respective pixel circuit,
wherein the signal writing operation is performed during the given image frame period simultaneously for those of the plurality of pixel circuits connected to a same unit write scanning line, and
wherein, for pixel circuits connected to different unit write scanning lines from each other, the signal writing operation is performed during the given image frame period at different respective timings.

(9)
The display unit of (3),
wherein N=4, R=2, K=4, and the display colors comprise red, green, and blue.

(10)
The display unit of (9),
wherein the display colors further comprise white.

(11)
The display unit of (9),
wherein the display colors further comprise yellow.

(12)
A display unit comprising:
a plurality of write scanning lines;
a plurality of signal lines; and
a plurality of pixel circuits disposed in a matrix form comprising rows and columns of pixel circuits, each of the plurality of pixel circuits including:
a display element,
a first transistor configured to sample a potential carried on one of the plurality of signal lines when a scanning pulse is applied to one of the plurality of write scanning lines, which is connected to the first transistor,
a capacitor with a first terminal configured to hold the potential sampled by the first transistor, and
a second transistor configured to supply a drive current to the display element, the magnitude of the drive current corresponding to a voltage between the first terminal of the capacitor and a second terminal of the capacitor,
wherein each of the plurality of pixel circuits corresponds to one of four display colors and the plurality of pixel circuits are grouped into display pixel units each comprising four of the plurality of pixel circuits corresponding respectively to the four display colors, which are contiguously disposed in two adjacent rows, and
the first transistor of a given one of the plurality of pixel circuits included in a first one of the display pixel units is disposed in a same layout orientation as the first transistor of the one of the plurality of pixel circuits included in a second one of the display pixel units adjacent to the first one of the display pixel units in a column direction that corresponds to a same color as the given one of the plurality of pixel circuits.

(13)
The display unit of (12),
wherein, for each of the plurality of pixel circuits included in the first one of the display pixel units and the second one of the display pixel units adjacent to the first one of the display pixel units in a column direction, the first transistors of those pixel circuits corresponding to a same color as each other are disposed in a same layout orientation as each other.

(14)
The display unit of (12), further comprising:
a plurality of power supply lines, each connected to two respectively corresponding adjacent rows of the plurality of pixel circuits,
wherein the plurality of write scanning lines are each connected to ones of the plurality of pixel circuits that are disposed in a corresponding row of pixel circuits,
the plurality of signal lines are each connected to ones of the plurality of pixel circuits that are disposed in a corresponding column of pixel circuits,
the plurality of pixel circuits are grouped into drive units each comprising four contiguous rows of pixel circuits that are connected to a corresponding unit power supply line, which is made up of two of the plurality of power supply lines configured as a common line,
each of the drive units includes two unit write scanning lines that each comprise two of the plurality of write scanning lines configured as a common line, and each unit write scanning line corresponds to at least one of the display colors and is connected to all of the pixel circuits that correspond to any of the display colors to which the respective unit write scanning line corresponds and that are included in the drive unit to which the respective unit write scanning line belongs.

(15)
The display unit of (14),
wherein, for each of the plurality of pixel circuits included in the given one of the drive units, the first transistors of those pixel circuits connected to a same unit write scanning line as each other are disposed in a same layout orientation as each other.

(16)
The display unit of (15),
wherein, for each of the plurality of pixel circuits included in the given one of the drive units, the second transistors of those pixel circuits connected to a same unit write scanning line as each other are disposed in a same layout orientation as each other.

(17)
The display unit of (16),
further comprising a drive control section configured to cause the plurality of pixel circuits to display image frames corresponding to input image data by control driving of the plurality of write scanning lines, the plurality of signal lines, and the plurality of power supply lines,
wherein the plurality of pixel circuits are configured to perform, under control of the drive control section, a threshold correction operation that results in storing a threshold voltage of the second transistor of the respective one of the plurality of pixel circuit in the capacitor of the respective one of the plurality of pixel circuit, and
the drive control section is configured to cause each of the plurality of pixel circuits included in the given one of the drive units to perform the threshold correction operation simultaneously during a given image frame period.

(18)
The display unit of (17),
wherein the drive control section is configured to cause each of the plurality of pixel circuits included in the given one of the drive units to perform the threshold correction operation by causing the first transistor of the respective pixel circuit to be in a conductive state while a reference potential is carried on the signal line connected to the respective pixel circuit and while a drive voltage is applied to the second transistor of the respective pixel circuit.

(19)
The display unit of (17),
wherein the drive control section is configured to cause the plurality of pixel circuits to perform a signal writing operation of sampling a video signal potential by placing the first transistor of the respective pixel circuit in a conductive state while a video signal potential is applied to the signal line connected to the respective pixel circuit,
wherein the signal writing operation is performed during the given image frame period simultaneously for those of the plurality of pixel circuits connected to a same unit write scanning line, and
wherein, for pixel circuits connected to different unit write scanning lines from each other, the signal writing operation is performed during the given image frame period at different respective timings.

(20)
The display unit of (14),
wherein the display colors comprise red, green, blue, and white.

(21)
A display panel comprising:
a plurality of pixels configured to include a plurality of kinds of sub-pixels having different luminescent colors with one another, and disposed in a matrix;
a first signal line and a second signal line configured to sandwich, in a row direction, a first pixel included in a first pixel row; and
a third signal line and a fourth signal line configured to sandwich, in the row direction, a second pixel included in a second pixel row adjacent to the first pixel row in the row direction and having a same luminescent color as that of the first pixel,
wherein the first pixel and the second pixel individually include a light emitting element and a pixel circuit driving the light emitting element,
the pixel circuit includes a first transistor including a gate electrode, a source electrode, and a drain electrode,
in a pixel circuit included in the first pixel, a source electrode or a drain electrode of the first transistor is connected to a left side signal line out of the first signal line and the second signal line,
in a pixel circuit included in the second pixel, a source electrode or a drain electrode of the first transistor is connected to a right side signal line out the third signal line and the fourth signal line, and
a disposition direction and an arrangement order of the gate electrode, the source electrode, and the drain electrode are same with each other in a first transistor in the pixel circuit included in the first pixel and a first transistor in the pixel circuit included in the second pixel.

(22)
The display panel of (21),
wherein the pixel circuit includes
the first transistor,
a second transistor including a gate electrode, a source electrode, and a drain electrode, and configured to drive the light emitting element, and
a holding capacitor configured to hold a gate-source voltage of the second transistor,
wherein a disposition direction and an arrangement order of the gate electrode, the source electrode, and the drain electrode are same with each other in a second transistor in the pixel circuit included in the first pixel and a second transistor in the pixel circuit included in the second pixel.

(23)
The display panel of (22),
wherein the arrangement order of the gate electrode, the source electrode, and the drain electrode is same with each other in the first transistor in the pixel circuit included in the first pixel, the second transistor in the pixel circuit included in the first pixel, the first transistor in the pixel circuit included in the second pixel, and the second transistor in the pixel circuit included in the second pixel.

(24)
The display panel of (21),
wherein the first signal line and the third signal line are a same signal line, and the second signal line and the fourth signal line are a same signal line

(25)
The display panel of (24),
wherein the first signal line and the second signal line include a first branch configured to extend in a direction crossing an extending direction of a main line of the first signal line and the second signal line, respectively, and the source electrode or the drain electrode of the first transistor is connected to the first branch.

(26)
The display panel of (25),
wherein in the first transistor, the arrangement order of the gate electrode, the source electrode, and the drain electrode is in parallel to the extending direction of the main line of the first signal line and the second signal line.

(27)
The display panel of (26),
wherein both a number of kinds of luminescent colors and a number of sub-pixels included in each pixel are four,
the four sub-pixels are put in a four-square arrangement, and
left-side or right-side two sub-pixels among the four sub-pixels are sandwiched by the first signal line and the second signal line in the row direction.

(28)
The display panel of (27), further comprising:
when two pixel rows are assumed to be one unit, two of a plurality of scanning lines configured to be assigned to the one unit, and used for selecting each pixel; and
one of a plurality of power source lines configured to be assigned to the one unit, and used for supplying drive current to each pixel,
wherein each of the scanning lines is connected to a plurality of sub-pixels having a same luminescent color in one unit, and
each of the power source lines is connected to all the sub-pixels in the one unit.

(29)
The display panel of (28),
wherein each of the scanning lines includes two second branches, and
each of the second branches cuts across a center of the four-square arrangement.

(30)
The display panel of (29),
wherein the gate electrode of the first transistor is connected to the second branch.

(31)
The display panel of (30),
wherein each of the power lines includes two third branches, and
each of the third branches cuts across a center of the four-square arrangement.

(32)
The display panel of (31),
wherein the pixel circuit includes
the first transistor,
a second transistor including a gate electrode, a source electrode, and a drain electrode, and configured to drive the light emitting element, and
a holding capacitor configured to hold a gate-source voltage of the second transistor,
wherein the arrangement order of the gate electrode, the source electrode, and the drain electrode is same with each other in the first transistor in the pixel circuit included in the first pixel, the second transistor in the pixel circuit included in the first pixel, the first transistor in the pixel circuit included in the second pixel, and the second transistor in the pixel circuit included in the second pixel.

(33)
The display panel of (21),
wherein the first signal line, the second signal line, the third signal line, and the fourth signal line are disposed in parallel in this order in the row direction.

(34)
The display panel of (33),
wherein the first signal line and the second signal line include a first branch configured to extend in a direction crossing an extending direction of a main line of the first signal line and the second signal line, respectively, and the source electrode or the drain electrode of the first transistor is connected to the first branch.

(35)
The display panel of (34),
wherein in the first transistor, the arrangement order of the gate electrode, the source electrode, and the drain electrode are in parallel to the extending direction of the main line of the first signal line and the second signal line.

(36)
The display panel of (35),
wherein both a number of kinds of luminescent colors and a number of sub-pixels included in each pixel are four,
the four sub-pixels are put in a four-square arrangement,
left-side two sub-pixels among the four sub-pixels are sandwiched by the first signal line and the second signal line in the row direction, and
right-side two sub-pixels among the four sub-pixels are sandwiched by the third signal line and the fourth signal line in the row direction.

(37)
A display apparatus comprising:
a display panel; and
a drive circuit configured to drive the display panel,
wherein the display panel includes
a plurality of pixels configured to include a plurality of kinds of sub-pixels having different luminescent colors with one another, and disposed in a matrix,
a first signal line and a second signal line configured to sandwich, in a row direction, a first pixel included in a first pixel row, and
a third signal line and a fourth signal line configured to sandwich, in the row direction, a second pixel included in a second pixel row adjacent to the first pixel row in the row direction and having a same luminescent color as that of the first pixel,
wherein the first pixel and the second pixel individually include a light emitting element and a pixel circuit driving the light emitting element,
the pixel circuit includes a first transistor including a gate electrode, a source electrode, and a drain electrode,
in a pixel circuit included in the first pixel, a source electrode or a drain electrode of the first transistor is connected to a left side signal line out of the first signal line and the second signal line,
in a pixel circuit included in the second pixel, a source electrode or a drain electrode of the first transistor is connected to a right side signal line out the third signal line and the fourth signal line, and
a disposition direction and an arrangement order of the gate electrode, the source electrode, and the drain electrode are same with each other in a first transistor in the pixel circuit included in the first pixel and a first transistor in the pixel circuit included in the second pixel.

(28) An electronic system comprising
a display apparatus,
the display apparatus including
a display panel, and
a drive circuit configured to drive the display panel, wherein the display panel includes
a plurality of pixels configured to include a plurality of kinds of sub-pixels having different luminescent colors with one another, and disposed in a matrix,
a first signal line and a second signal line configured to sandwich, in a row direction, a first pixel included in a first pixel row, and
a third signal line and a fourth signal line configured to sandwich, in the row direction, a second pixel included in a second pixel row adjacent to the first pixel row in the row direction and having a same luminescent color as that of the first pixel,
wherein the first pixel and the second pixel individually include a light emitting element and a pixel circuit driving the light emitting element,
the pixel circuit includes a first transistor including a gate electrode, a source electrode, and a drain electrode,
in a pixel circuit included in the first pixel, a source electrode or a drain electrode of the first transistor is connected to a left side signal line out of the first signal line and the second signal line,
in a pixel circuit included in the second pixel, a source electrode or a drain electrode of the first transistor is connected to a right side signal line out the third signal line and the fourth signal line, and
a disposition direction and an arrangement order of the gate electrode, the source electrode, and the drain electrode are same with each other in a first transistor in the pixel circuit included in the first pixel and a first transistor in the pixel circuit included in the second pixel.

The present disclosure contains subject matter related to that disclosed in Japanese Priority Patent Application JP 2012-170305 filed in the Japan Patent Office on Jul. 31, 2012, the entire contents of which are hereby incorporated by reference.

What is claimed is:

1. A display unit comprising:
a plurality of write scanning lines;
a plurality of signal lines;
a plurality of pixel circuits disposed in a matrix form comprising rows and columns, the plurality of pixel circuits respectively including:
a display element,
a first transistor configured to sample a potential carried on one of the plurality of signal lines when a scanning pulse is applied to one of the plurality of write scanning lines, which is connected to the first transistor,
a capacitor with a first terminal configured to hold the potential sampled by the first transistor, and
a second transistor configured to supply a drive current to the display element, the magnitude of the drive current corresponding to a voltage between the first terminal of the capacitor and a second terminal of the capacitor,
wherein each of the plurality of pixel circuits corresponds to one of N display colors and the plurality of pixel circuits are grouped into display pixel units each comprising N of the plurality of pixel circuits corresponding respectively to the N display colors, which are contiguously disposed in R contiguous rows, $2 \leq R \leq N$, and
the first transistor of a given one of the plurality of pixel circuits included in a first one of the display pixel units is disposed in a same layout orientation as the first transistor of the one of the plurality of pixel circuits included in a second one of the display pixel units adjacent to the first one of the display pixel units in a column direction that corresponds to a same color as the given one of the plurality of pixel circuits; and
a plurality of power supply lines, each connected to two respectively corresponding adjacent rows of the plurality of pixel circuits,
wherein the plurality of write scanning lines are each connected to ones of the plurality of pixel circuits that are disposed in a corresponding row of pixel circuits,
the plurality of signal lines are each connected to ones of the plurality of pixel circuits that are disposed in a corresponding column of pixel circuits,
the plurality of pixel circuits are grouped into drive units each comprising $K \geq 4$ contiguous rows of pixel circuits that are connected to a corresponding unit power supply line, which is made up of K/2 of the plurality of power supply lines connected together,
each of the drive units includes $L \geq 2$ unit write scanning lines that each comprise $R \geq 2$ of the plurality of write scanning lines connected together, where $K = L \cdot R$, and
each unit write scanning line corresponds to at least one of the display colors and is connected to all of the pixel circuits that correspond to any of the display colors to which the respective unit write scanning line corresponds and that are included in the drive unit to which the respective unit write scanning line belongs.

2. The display unit of claim 1,
wherein, for each of the plurality of pixel circuits included in the first one of the display pixel units and the second one of the display pixel units adjacent to the first one of the display pixel units in a column direction, the first transistors of those pixel circuits corresponding to a same color as each other are disposed in a same layout orientation as each other.

3. The display unit of claim 1,
wherein, for each of the plurality of pixel circuits included in the given one of the drive units, the first transistors of those pixel circuits connected to a same unit write scanning line as each other are disposed in a same layout orientation as each other.

4. The display unit of claim 3,
wherein, for each of the plurality of pixel circuits included in the given one of the drive units, the second transistors of those pixel circuits connected to a same unit write scanning line as each other are disposed in a same layout orientation as each other.

5. The display unit of claim 4,
further comprising a drive control section configured to cause the plurality of pixel circuits to display image frames corresponding to input image data by control driving of the plurality of write scanning lines, the plurality of signal lines, and the plurality of power supply lines,
wherein the plurality of pixel circuits are configured to perform, under control of the drive control section, a threshold correction operation that results in storing a threshold voltage of the second transistor of the respective one of the plurality of pixel circuit in the capacitor of the respective one of the plurality of pixel circuit, and the drive control section is configured to cause each of the plurality of pixel circuits included in the given one of the drive units to perform the threshold correction operation simultaneously during a given image frame period.

6. The display unit of claim 5,
wherein the drive control section is configured to cause each of the plurality of pixel circuits included in the given one of the drive units to perform the threshold correction operation by causing the first transistor of the respective pixel circuit to be in a conductive state while a reference potential is carried on the signal line connected to the respective pixel circuit and while a drive voltage is applied to the second transistor of the respective pixel circuit.

7. The display unit of claim 5,
wherein the drive control section is configured to cause the plurality of pixel circuits to perform a signal writing operation of sampling a video signal potential by placing the first transistor of the respective pixel circuit in a conductive state while a video signal potential is applied to the signal line connected to the respective pixel circuit,
wherein the signal writing operation is performed during the given image frame period simultaneously for those of the plurality of pixel circuits connected to a same unit write scanning line, and
wherein, for pixel circuits connected to different unit write scanning lines from each other, the signal writing operation is performed during the given image frame period at different respective timings.

8. The display unit of claim 1,
wherein N=4, R=2, K=4, and the display colors comprise red, green, and blue.

9. The display unit of claim 8,
wherein the display colors further comprise white.

10. The display unit of claim 8,
wherein the display colors further comprise yellow.

11. A display unit comprising:
a plurality of write scanning lines;
a plurality of signal lines;
a plurality of pixel circuits disposed in a matrix form comprising rows and columns, the plurality of pixel circuits respectively including:
  a display element,
  a first transistor configured to sample a potential carried on one of the plurality of signal lines when a scanning pulse is applied to one of the plurality of write scanning lines, which is connected to the first transistor,
  a capacitor with a first terminal configured to hold the potential sampled by the first transistor, and
  a second transistor configured to supply a drive current to the display element, the magnitude of the drive current corresponding to a voltage between the first terminal of the capacitor and a second terminal of the capacitor,
wherein each of the plurality of pixel circuits corresponds to one of four display colors and the plurality of pixel circuits are grouped into display pixel units each comprising four of the plurality of pixel circuits corresponding respectively to the four display colors, which are contiguously disposed in two adjacent rows, and
the first transistor of a given one of the plurality of pixel circuits included in a first one of the display pixel units is disposed in a same layout orientation as the first transistor of the one of the plurality of pixel circuits included in a second one of the display pixel units adjacent to the first one of the display pixel units in a column direction that corresponds to a same color as the given one of the plurality of pixel circuits; and
a plurality of power supply lines, each connected to two respectively corresponding adjacent rows of the plurality of pixel circuits,
wherein the plurality of write scanning lines are each connected to ones of the plurality of pixel circuits that are disposed in a corresponding row of pixel circuits,
the plurality of signal lines are each connected to ones of the plurality of pixel circuits that are disposed in a corresponding column of pixel circuits,
the plurality of pixel circuits are grouped into drive units each comprising four contiguous rows of pixel circuits that are connected to a corresponding unit power supply line, which is made up of two of the plurality of power supply lines connected together,
each of the drive units includes two unit write scanning lines that each comprise two of the plurality of write scanning lines connected together, and
each unit write scanning line corresponds to at least one of the display colors and is connected to all of the pixel circuits that correspond to any of the display colors to which the respective unit write scanning line corresponds and that are included in the drive unit to which the respective unit write scanning line belongs.

12. The display unit of claim 11,
wherein, for each of the plurality of pixel circuits included in the first one of the display pixel units and the second one of the display pixel units adjacent to the first one of the display pixel units in a column direction, the first transistors of those pixel circuits corresponding to a same color as each other are disposed in a same layout orientation as each other.

13. The display unit of claim 11,
wherein, for each of the plurality of pixel circuits included in the given one of the drive units, the first transistors of those pixel circuits connected to a same unit write scanning line as each other are disposed in a same layout orientation as each other.

14. The display unit of claim 13,
wherein, for each of the plurality of pixel circuits included in the given one of the drive units, the second transistors of those pixel circuits connected to a same unit write scanning line as each other are disposed in a same layout orientation as each other.

15. The display unit of claim 14,
further comprising a drive control section configured to cause the plurality of pixel circuits to display image frames corresponding to input image data by control driving of the plurality of write scanning lines, the plurality of signal lines, and the plurality of power supply lines,
wherein the plurality of pixel circuits are configured to perform, under control of the drive control section, a threshold correction operation that results in storing a threshold voltage of the second transistor of the respective one of the plurality of pixel circuit in the capacitor of the respective one of the plurality of pixel circuit, and
the drive control section is configured to cause each of the plurality of pixel circuits included in the given one of the drive units to perform the threshold correction operation simultaneously during a given image frame period.

16. The display unit of claim 15,
wherein the drive control section is configured to cause each of the plurality of pixel circuits included in the given one of the drive units to perform the threshold correction operation by causing the first transistor of the respective pixel circuit to be in a conductive state while a reference potential is carried on the signal line connected to the respective pixel circuit and while a drive voltage is applied to the second transistor of the respective pixel circuit.

17. The display unit of claim 15,
wherein the drive control section is configured to cause the plurality of pixel circuits to perform a signal writing operation of sampling a video signal potential by placing the first transistor of the respective pixel circuit in a conductive state while a video signal potential is applied to the signal line connected to the respective pixel circuit,
wherein the signal writing operation is performed during the given image frame period simultaneously for those of the plurality of pixel circuits connected to a same unit write scanning line, and
wherein, for pixel circuits connected to different unit write scanning lines from each other, the signal writing operation is performed during the given image frame period at different respective timings.

18. The display unit of claim 11, wherein the display colors comprise red, green, blue, and white.

\* \* \* \* \*